US007539613B2

(12) United States Patent
Takada

(10) Patent No.: US 7,539,613 B2
(45) Date of Patent: May 26, 2009

(54) DEVICE FOR RECOVERING MISSING FREQUENCY COMPONENTS

(75) Inventor: Masashi Takada, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 363 days.

(21) Appl. No.: 10/545,435

(22) PCT Filed: Feb. 10, 2004

(86) PCT No.: PCT/JP2004/001427

§ 371 (c)(1),
(2), (4) Date: Aug. 12, 2005

(87) PCT Pub. No.: WO2004/072958

PCT Pub. Date: Aug. 26, 2004

(65) Prior Publication Data

US 2007/0168185 A1 Jul. 19, 2007

(30) Foreign Application Priority Data

Feb. 14, 2003 (JP) ............................ 2003-036607

(51) Int. Cl.
*G10L 19/00* (2006.01)
*G10L 21/00* (2006.01)
*H03G 3/00* (2006.01)

(52) U.S. Cl. ....................... 704/205; 704/225; 330/278; 455/118

(58) Field of Classification Search ................. 704/203, 704/205, 206, 208, 214, 225; 381/94.1, 94.2, 381/94.3; 330/278, 279; 455/20, 118
See application file for complete search history.

(56) References Cited

U.S. PATENT DOCUMENTS 3,828,133 A 8/1974 Ishigami et al.
3,991,370 A * 11/1976 Pate ........................... 455/108
4,208,548 A * 6/1980 Orban ....................... 381/94.8

(Continued)

FOREIGN PATENT DOCUMENTS

EP 1 357 733 A 10/2003

(Continued)

OTHER PUBLICATIONS

Japanese Patent Office Action (Notification Of Reason for Refusal) dated Aug. 25, 2008, issued in corresponding Japanese Patent Application No. 2004-206996, with translation.

*Primary Examiner*—Martin Lerner
(74) *Attorney, Agent, or Firm*—Venable LLP; Michael A. Sartori; Catherine M. Voorhees

(57) ABSTRACT

A band recovering device recovers frequency components lying in a frequency band lost due to band-limitation of a sound signal. The device includes a peak-limiting amplifier for amplifying an input narrow-band signal while preventing the resulting amplified signal from exceeding a maximum amplitude. A peak-limitation detector detects the level of the amplified signal output. An amplification controller increases the amplification factor and/or the amount of amplification of the peak-limiting amplifier in accordance with the level of the amplified signal. A band recovering circuit generates, based on the amplified signal output from the peak-limiting amplifier and input narrow-band signal, a band-recovered signal including the frequency components lying in the missing band.

8 Claims, 22 Drawing Sheets

U.S. PATENT DOCUMENTS

| | | | | | |
|---|---|---|---|---|---|
| 4,406,923 | A * | 9/1983 | Burne et al. | 381/108 |
| 4,410,764 | A * | 10/1983 | Werth et al. | 704/203 |
| 4,495,643 | A * | 1/1985 | Orban | 381/94.8 |
| 5,127,054 | A | 6/1992 | Hong et al. | |
| 5,170,495 | A * | 12/1992 | McNicol et al. | 455/116 |
| 5,455,888 | A | 10/1995 | Rabipour et al. | |
| 5,706,352 | A * | 1/1998 | Engebretson et al. | 381/312 |
| 5,852,535 | A * | 12/1998 | Richardson et al. | 360/77.12 |
| 6,023,513 | A | 2/2000 | Case | |
| 6,061,551 | A * | 5/2000 | Sorrells et al. | 455/118 |
| 6,091,940 | A * | 7/2000 | Sorrells et al. | 455/118 |
| 6,480,722 | B1 * | 11/2002 | Takada et al. | 455/501 |
| 6,505,032 | B1 * | 1/2003 | McCorkle et al. | 455/41.2 |
| 6,691,083 | B1 * | 2/2004 | Breen | 704/220 |
| 6,694,017 | B1 * | 2/2004 | Takada | 379/402 |
| 6,704,711 | B2 * | 3/2004 | Gustafsson et al. | 704/258 |
| 6,774,834 | B2 * | 8/2004 | Dartois | 341/144 |
| 6,828,859 | B2 * | 12/2004 | Dupuis | 330/279 |
| 6,889,182 | B2 * | 5/2005 | Gustafsson | 704/205 |
| 7,110,435 | B1 * | 9/2006 | Sorrells et al. | 375/147 |
| 7,308,242 | B2 * | 12/2007 | Sorrells et al. | 455/313 |
| 2002/0016698 | A1 | 2/2002 | Tokuda | |
| 2002/0128839 | A1 | 9/2002 | Gustafsson et al. | |
| 2002/0150266 | A1 * | 10/2002 | Hinkle et al. | 381/104 |
| 2006/0142999 | A1 * | 6/2006 | Takada et al. | 704/205 |

FOREIGN PATENT DOCUMENTS

| | | |
|---|---|---|
| JP | 49302 | 7/1973 |
| JP | 2002-82685 | 3/2002 |
| WO | WO 03/019534 A | 3/2003 |

* cited by examiner

DEVICE FOR RECOVERING MISSING FREQUENCY COMPONENTS

BACKGROUND OF THE INVENTION

1. Field of the Invention

The present invention relates to a band recovering device and a telephone set using the same. More particularly, the present invention relates to a band recovering device for recovering the frequency components of, e.g., a voice signal lying in a band lost due to band-limitation during transmission on, e.g., a telephone line, and a telephone set using the same.

2. Description of the Background Art

When a voice signal representative of the voice is transmitted over, e.g., a telephone line, a voice signal lies in a limited frequency band. As a result, frequency components, originally lying in a band excluded by limitation, are suppressed and therefore lost, degrading the quality of the voice signal.

In light of the above, Japanese patent laid-open publication No. 2002-82685, for example, discloses a voice band expanding device for generating virtual frequency components that should lie in the missing band and a device for practicing the same. The voice band expanding device samples an input voice signal with a sampling frequency four times as high as the upper limit frequency component for converting the voice signal to a digital voice signal. The device then uses the folding or shifting of the sampling frequency to fold or shift symmetrically, respectively, voice signal components lying in the low-frequency band of the digital voice signal to the high-frequency side. The device thus expands the frequency band of the input voice signal.

However, as the voice band expanding device described above folds or shifts the voice signal components of the low frequency band to the high-frequency side to expand virtually the frequency band, the device does not recover the frequency band on the basis of the data of the voice signal itself. More specifically, to restore voice signal components lying in the missing frequency band, the device simply makes the input voice signal zero on every other sampling point or inverts the sign of every other sampling data of the voice signal for effecting the folding or the shift to expand virtually the band.

SUMMARY OF THE INVENTION

It is an object of the present invention to provide a band recovering device capable of reproducing the frequency components lying in the missing band, on the basis of the input voice signal, and a telephone set using the same.

In accordance with the present invention, a band recovering device recovers frequency components lying in a frequency band lost due to band-limitation of a sound signal. The device includes a peak-limiting amplifier for amplifying an input narrow-band signal while preventing the resulting amplified signal from exceeding a maximum amplitude. A peak-limitation detector detects the level of the amplified signal output. An amplification controller increases at least one of the amplification factor and amount of amplification of the peak-limiting amplifier in accordance with the level of the amplified signal. A band recovering circuit restores, based on the amplified signal output from the peak-limiting amplifier and input narrow-band signal, a band-recovered signal including the frequency components lying in the frequency band lost.

A telephone set including the above band recovering device is also disclosed.

BRIEF DESCRIPTION OF THE DRAWINGS

The objects and features of the present invention will become more apparent from consideration of the following detailed description taken in conjunction with the accompanying drawings in which:

FIG. 18 shows the waveform of a specific signal Snarrow appearing in the thirteenth embodiment.

DESCRIPTION OF THE PREFERRED EMBODIMENTS

Figure 1:
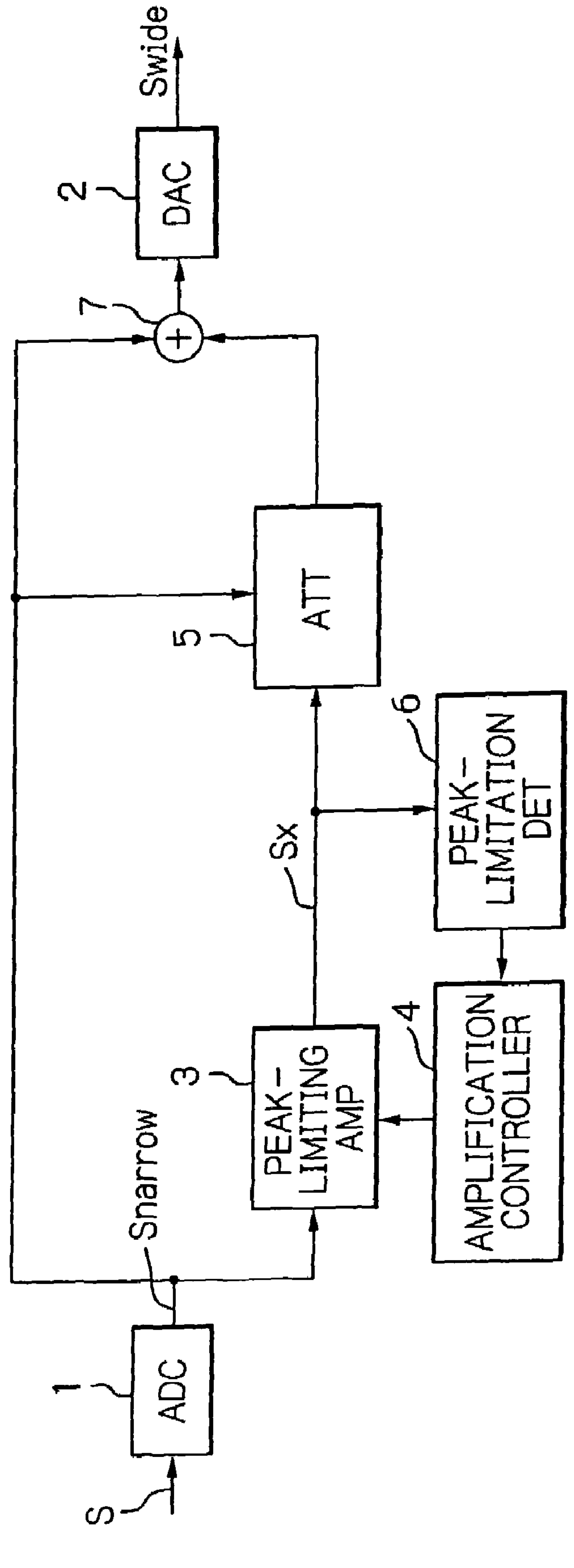
FIG. 1 is a schematic block diagram showing a first embodiment of the band recovering device in accordance with the present invention.

Referring to FIG. 1 of the drawings, a first embodiment of the band recovering device in accordance with the present invention is generally made up of an ADC (Analog-to-Digital Converter) 1, a peak-limiting amplifier 3, a peak-limitation detector 6, an attenuator 5, an amplification controller 4, an adder 7, and a DAC (Digital-to-Analog Converter) 2 as interconnected as illustrated.

An analog voice signal S is input to the analog-to-digital converter 1 from the outside of the band recovering device, e.g., a central office on a telephone line. The analog-to-digital converter 1 samples the analog voice signal S with, e.g., a sampling frequency higher than the upper-limit frequency of the voice signal S to convert the analog signal S to a digital signal Snarrow. The digital signal Snarrow thus produced is fed from the analog-to-digital converter 1 to the peak-limiting amplifier 3 and adder 7.

In the illustrative embodiment, the analog voice signal S is limited in frequency band before it is input to the band recovering device. For example, in general, the voice signal S, when coming from a telephone subscriber set, not shown, is limited to a frequency band ranging from 340 Hz to 4,000 Hz. In the illustrative embodiment, the analog-to-digital converter 1 effects analog-to-digital conversion with a sampling frequency, 16 kHz, which is four times as high as the upper limit frequency, 4,000 Hz, of the voice signal S although such a sampling frequency is not restrictive.

The peak limiting amplifier 3 amplifies the amplitudes, i.e., signal values of the digital signal Snarrow input from the analog-to-digital converter 1. When any signal value thus amplified is greater than a preselected maximum value, the peak limiting amplifier 3 reduces the signal value to the maximum value. More specifically, the peak-limiting amplifier 3 amplifies the signal Snarrow by an amount controlled by the amplification controller 4 to output a signal Sx. The signal Sx is delivered from the amplifier 3 to the peak-limitation detector 6 and attenuator 5.

In the illustrative embodiment, the amount of amplification refers to the level of a signal measured in dBm, dBW, dBmV or similar absolute unit. On the other hand, an amplification factor refers to the ratio of a signal output from a device to a signal input to the same and measured in dB, % or similar relative unit. While the illustrative embodiment uses the amount of amplification, the present invention is practicable with an amplification factor as well.

The peak-limitation detector 6 determines whether or not the signal value or digital signal data of the signal Sx input thereto is coincident with the maximum value. If the signal value is not coincident with the maximum value, then the detector 6 delivers to the amplification controller 4 a request signal requesting it to increase the amount of amplification of the peak-limiting amplifier 3. For example, the detector 6 requests the amplification controller 4 to increase the amount of amplification until it reaches the maximum value. After detecting the maximum value, the detector 6 stops outputting the above request signal. Basically, the peak-limitation detector 6 does not request the amplification controller 4 to reduce the amount of amplification.

In the illustrative embodiment, the analog-to-digital converter 1 is assumed to be a sixteen-bit analog-to-digital converter. The peak-limitation detector 6 therefore determines whether or not the digital signal data input thereto is +32767 or −32768 although such a digital value is only illustrative.

The initial amount of amplification of the peak-limiting amplifier 3 is such that the signal Sx is the same in level as the signal Snarrow. Every time the peak-limitation detector 6 delivers the request signal to the amplification controller 4, the amplification controller 4 increases the amount of amplification of the peak-limiting amplifier 3 from the initial amount. For example, the amplification controller 4 increases the amount of amplification until the signal value reaches the maximum value in accordance with the request from the peak-limitation detector 6 and maintains, after the detector 6 has detected the maximum value, the amount of amplification of that instant.

The attenuator 5 attenuates the signal Sx input from the peak-limiting amplifier 3. More specifically, the attenuator 5 compares the signal Snarrow input from the analog-to-digital converter to the signal Sx for every preselected period of time, for example, every second, every frame (for example, ten millisecond), or every fifty thousand samples, with respect to, for example, the maximum values or the averages of those signals. The attenuator 5 adjusts the amplitudes of the signal Sx such that the signals Snarrow and Sx will be added by the adder 7 in a ratio of 3:1. The signal Sx thus adjusted by the attenuator 5 is input to the adder 7.

The adder 7 adds the signal Sx input from attenuator 5, to the signal Snarrow input from the analog-to-digital converter 1, and feeds the resulting sum signal to the digital-to-analog converter 2. It is noted that the present invention is not restricted to the case where the addition or mixing ratio is 3:1.

On receiving the digital sum signal output from the adder 7, the digital-to-analog converter 2 converts the sum signal to an analog signal Swide and feeds the analog signal Swide to, e.g., a receiver included in a telephone set not shown.

How the illustrative embodiment recovers the frequency components of a band included in the original voice signal, but lost due to band-limitation, by adding the signal Snarrow to the amplified signal Sx will be described in detail hereinafter.

Figure 2:
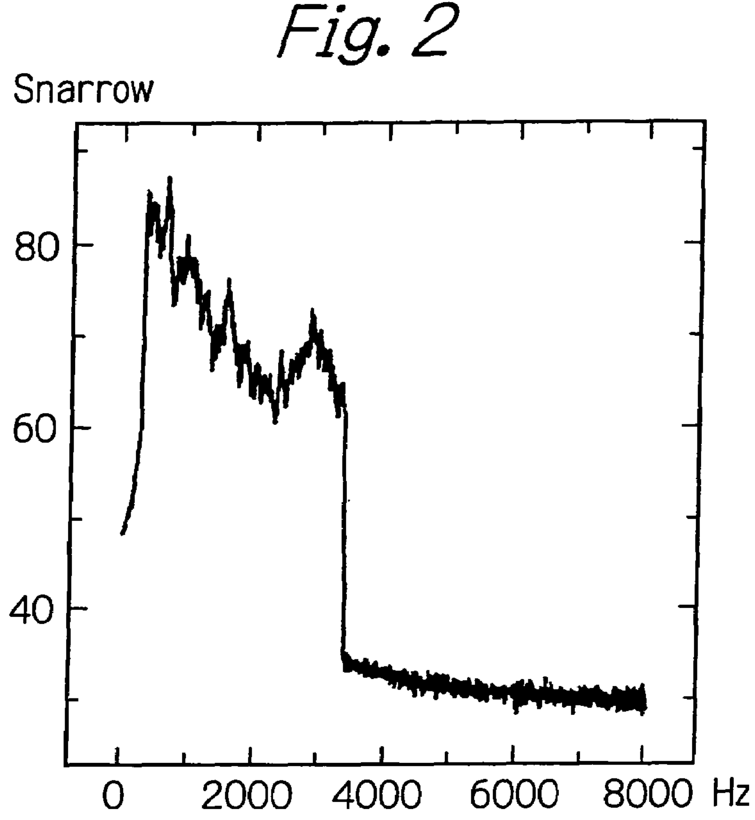
FIG. 2 is a graph showing the frequency characteristic of a signal Snarrow appearing in the first embodiment.

FIG. 2 plots a specific frequency characteristic of the voice signal Snarrow output from the analog-to-digital converter 1. In FIG. 2, the ordinate and abscissa indicate the relative strength of the voice signal Snarrow and frequency, respectively. As shown, the voice signal Snarrow input to the peak-limiting amplifier 3 has been limited in frequency band. Should the signal Snarrow be not amplified by the amplifier 3, the signal Snarrow would be output to, e.g., the receiver of a telephone set, not shown, via the adder 7 with the same frequency characteristic.

Figure 3:
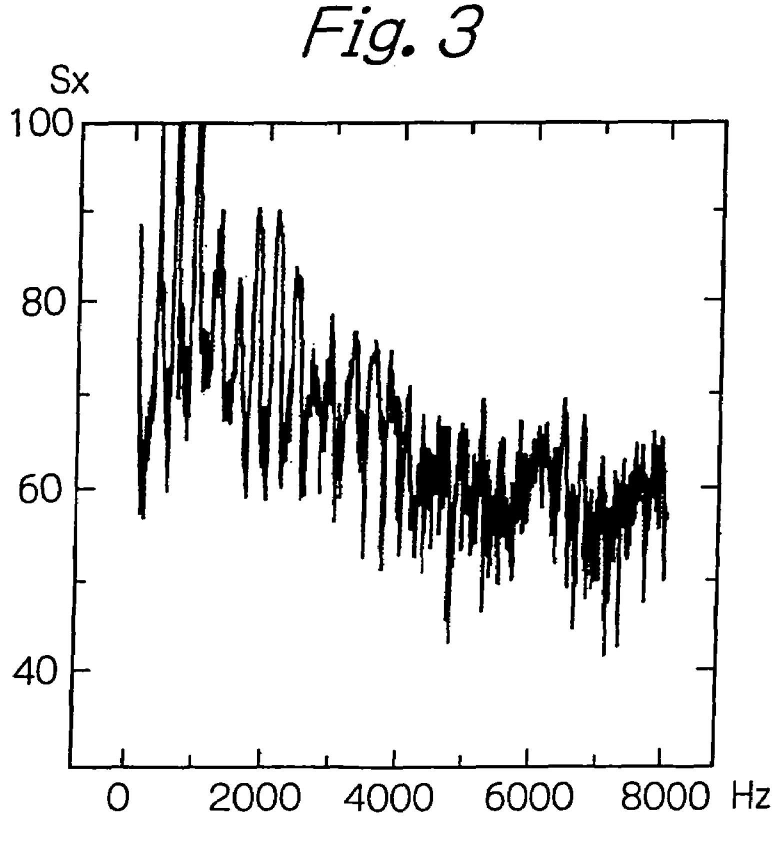
FIG. 3 is a graph showing the frequency characteristic of a signal Sx derived from the signal Snarrow.

By contrast, the signal Sx, amplified to the maximum value by the peak-limiting amplifier 3, contains the frequency components of the band lost due to band-limitation as well. FIG. 3 plots the frequency characteristic of the signal Sx output from the peak-limiting amplifier 3; the ordinate and abscissa indicate the relative strength of the voice signal Snarrow and frequency, respectively. Why the signal Sx contains the missing frequency components is that the almost all amplitudes of the signal Snarrow are limited in maximum value and therefore have a "truncated" waveform analogous to a rectangular waveform.

More specifically, a rectangular wave has the first fundamental frequency and frequency components that are integral multiples of the fundamental frequency, as known in the art. Therefore, by amplifying the signal Snarrow to the maximum value, it is possible to shape the signal Snarrow into a waveform analogous to a rectangular waveform. This is why the amplified signal Sx has a frequency component corresponding to the fundamental frequency of the original voice signal and frequency components that are integral multiples thereof.

On the other hand, vowels, in particular, included in a voice signal fortunately consist of the first fundamental frequency or period and frequency components that are integral multiples thereof. In light of this, the illustrative embodiment compensates frequency components missing in the signal Snarrow by using, among the frequency components of the signal Sx amplified to the maximum value, frequency components of 4,000 Hz to 8,000 Hz shown in FIG. 3 specifically.

The attenuator 5 attenuates the signal Sx input from the peak-limiting amplifier 3 so as to free the original signal from excessive influence. At this instant, the waveform with the limited tops is also attenuated as it is.

The amount of attenuation to be effected by the attenuator 5 should only be set be forehand. In the illustrative embodiment, the amount of attenuation is such that the power ratio between the signal Snarrow, which is applied to one input of the adder 7, and the attenuated signal Sx is, but not limited to, 3:1, as stated earlier.

As stated above, in the illustrative embodiment, the peak-limiting amplifier 3 amplifies the signal values of the narrow-band digital signal Snarrow while limiting, when any signal value is above the maximum value, the former to the latter. The amplification controller 4 controls, in accordance with the output of the peak-limitation detector 6, the amount of amplification of the peak-limiting amplifier 3 such that the maximum value appears in the signal without fail. Further, the attenuator 5 adjusts the mixing ratio of the amplification-controlled signal to the original waveform to thereby control the pitch. By so limiting the tops of a voice waveform, the illustrative embodiment restores, among the original frequency components of a voice signal, the frequency components of a missing band from the voice waveform itself.

Further, a telephone set, using the voice signal recovered by the illustrative embodiment, can provide communication with high voice signal quality.

Figure 4:
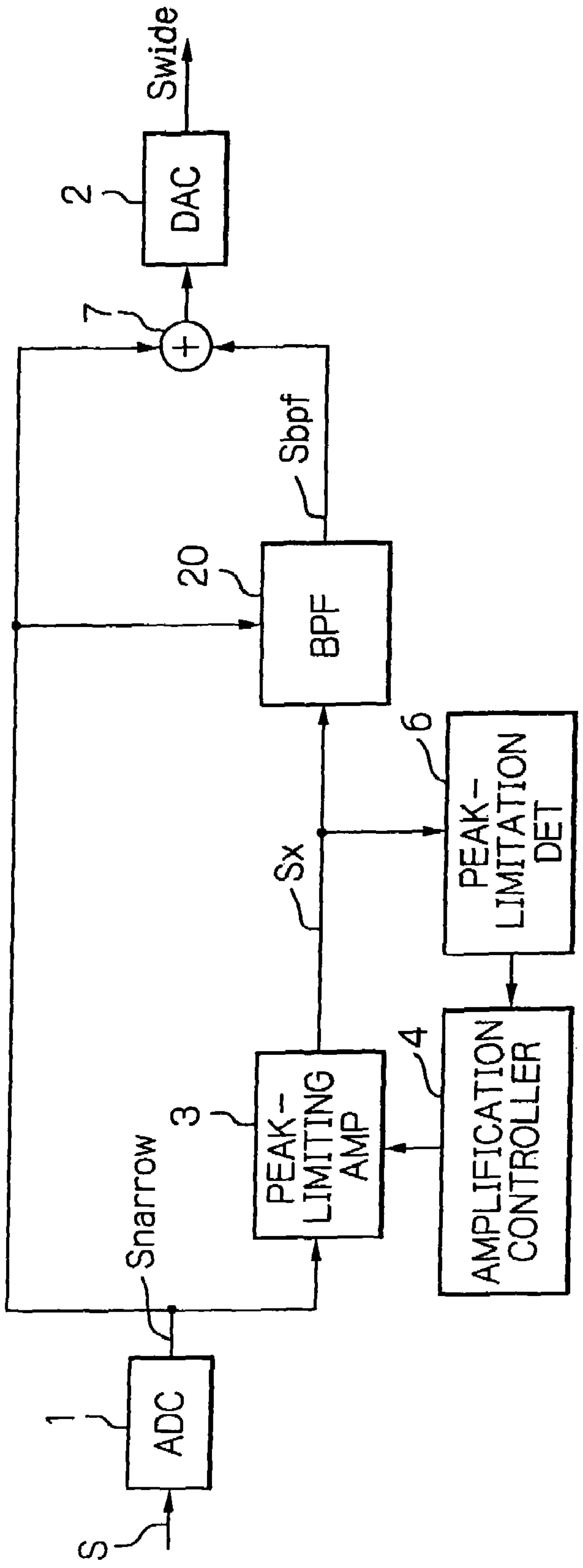
FIG. 4 is a schematic block diagram showing a second embodiment of the band recovering device in accordance with the present invention.

Reference will be made to FIG. 4 for describing a second embodiment of the band recovering device in accordance with the present invention. As shown, the second embodiment is similar to the first embodiment except that a BPF (Band-Pass Filter) 20 is substituted for the attenuator 5, FIG. 1. In the drawings, like structural elements are designated by identical reference numerals, and a detailed description thereof will not be made in order to avoid redundancy. The following description about FIG. 4 will concentrate on the function of the band-pass filter 20.

The band-pass filter 20 filters out frequency components lower than, e.g., 4,000 Hz. More specifically, the band-pass filter 20 filters out, among the frequency components of the signal Sx input from the peak-limiting amplifier 3, frequency components lower than 4,000 Hz while passing frequency components Sbpf higher than 4,000 Hz inclusive to the adder 7.

The significance of the band-pass filter 20 particular to the illustrative embodiment will be described hereinafter. The signal Sx output from the peak-limiting amplifier 3 has frequency components ranging from 0 Hz to 8,000 Hz as voice signal components, as described with reference to FIG. 3. However, the frequency components of the signal Sx actually used for band recovery lie in the range of from 4,000 Hz to 8,000 Hz. In light of this, the band-pass filter 20, substituted for the attenuator 5 of the previous embodiment, effects the attenuation of the signal Sx and the omission of the unnecessary frequency band at the same time.

Figure 5:
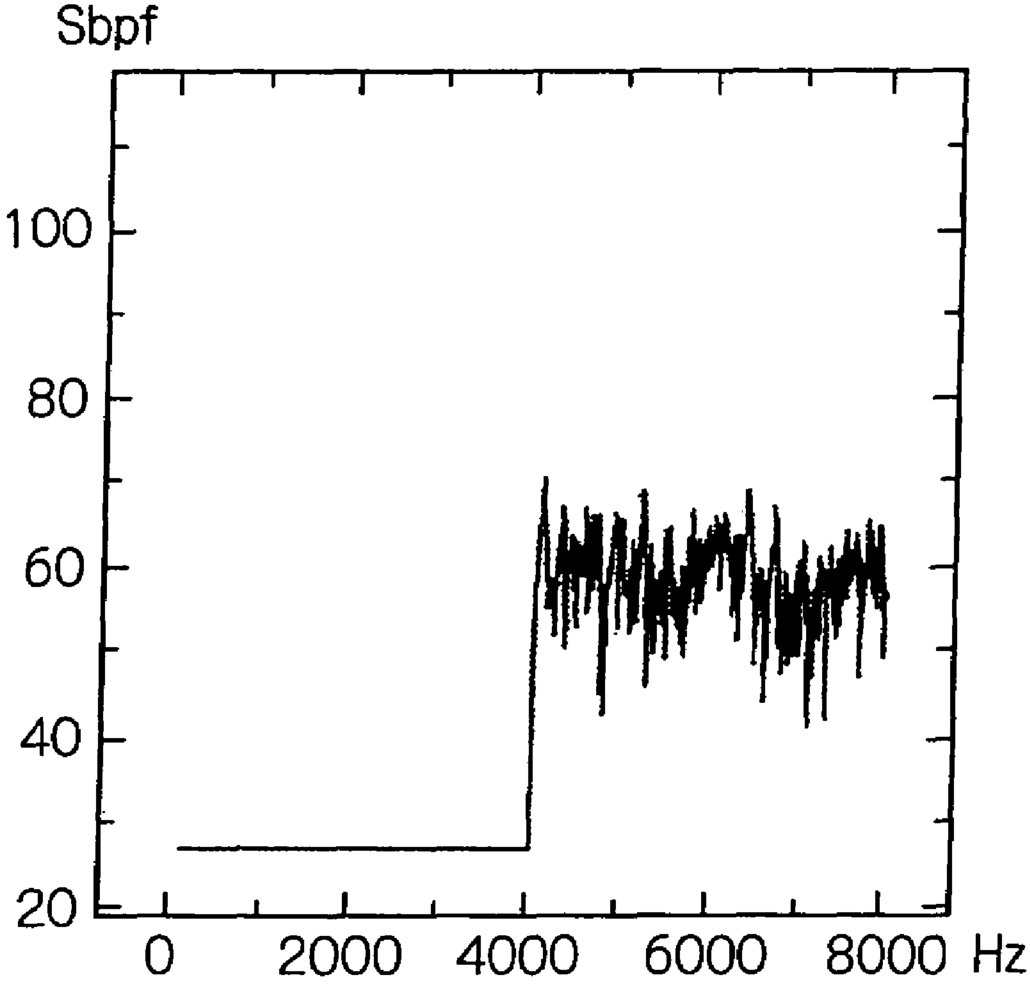
FIG. 5 is a graph showing the frequency characteristic of a signal Sx particular to the second embodiment.

In operation, the signal Sx output from the peak-limiting amplifier 3 is input to the band-pass filter 20. The band-pass filter 20 filters out frequency components lower than 4,000 Hz and delivers the resulting signal Sbpf to the adder 7. FIG. 5 plots the frequency characteristic of the signal Sbpf; the ordinate and abscissa indicate the relative strength of a voice signal and frequency, respectively.

The band-pass filter 20 shapes the spectrum distribution of the input signal Sx. By comparing the amplitude of the signal Snarrow to that of the signal Sbpf, the band-pass filter 20 also adjusts signal amplitudes such that the ratio of the original signal Snarrow to the output signal Sbpf is, but not limited to, 3:1.

The adder 7 adds the signal Sbpf output from the band-pass filter 20 to the signal Snarrow to thereby restore the signal whose frequency components lie in the band ranging from 0 Hz to 8,000 Hz. This digital signal is fed from the adder 7 to the digital-to-analog converter 2. The digital-to-analog converter 2 converts the digital signal to an analog signal as in the previous embodiment.

As stated above, with the band-pass filter 20 substituted for the attenuator 5, the illustrative embodiment recovers the band by using only frequency components necessary for recovery while leaving the other frequency components, which should not be enhanced, as they are. The illustrative embodiment therefore improves the quality of a sound signal more than the previous embodiment.

Figure 6:
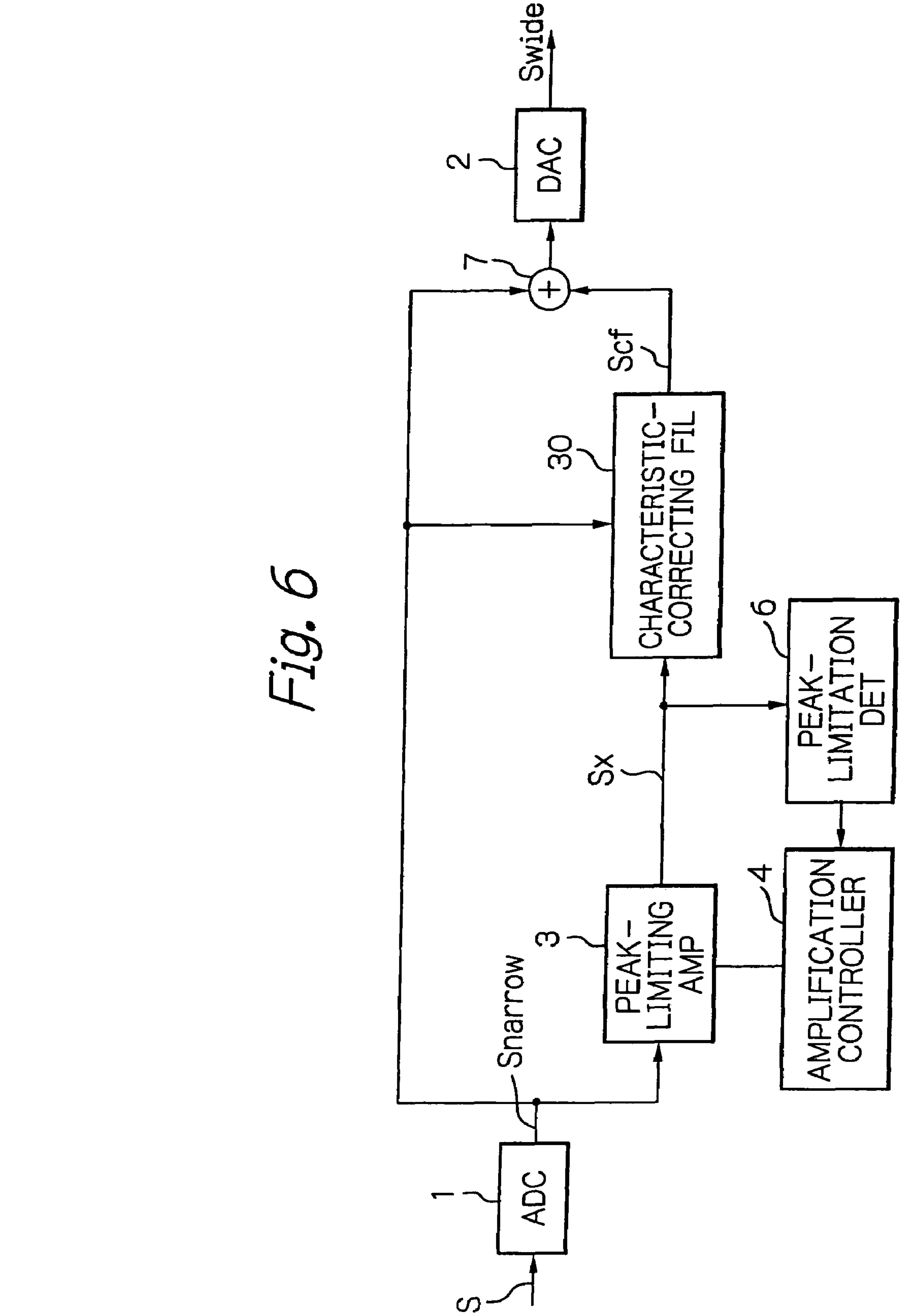
FIG. 6 is a schematic block diagram showing a third embodiment of the band recovering device in accordance with the present invention.

FIG. 6 shows a third embodiment of the band recovering device in accordance with the present invention. As shown, the third embodiment is similar to the second embodiment except that a characteristic correcting filter 30 is substituted for the band-pass filter 20, FIG. 4. The following description about FIG. 6 will concentrate on the function of the characteristic correcting filter 30.

Figure 7:
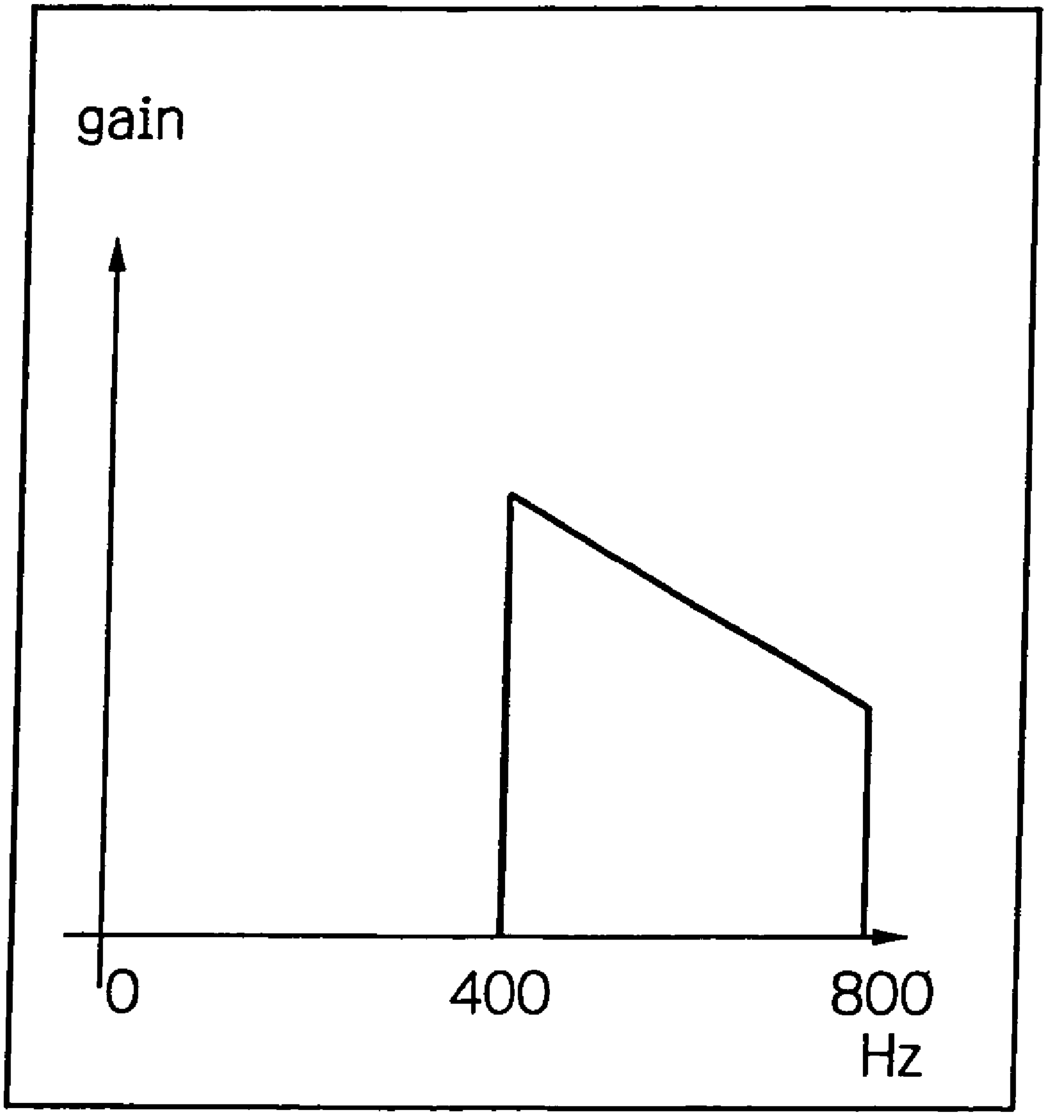
FIG. 7 is a graph showing the frequency characteristic of a signal Sx particular to the third embodiment.

The characteristic correcting filter 30 filters out, among the frequency components of the input signal Sx, frequency components lower than 4,000 Hz like the band-pass filter 20, FIG. 4. The filter 30 also executes frequency shaping such that the amount of attenuation increases with an increase in frequency. FIG. 7 plots a specific frequency characteristic of a signal Scf so processed by the filter 30; the ordinate and abscissa indicate the level of a gain and frequency, respectively. The unit of a gain is dB or % by way of example.

In operation, the filter 30 filters out, among the frequency components of the signal Sx, frequency components lower than 4,000 Hz while increasing the amount of attenuation with an increase in frequency. More specifically, the filter 30 adjusts the frequency distribution of the signal Sx. By comparing the amplitude of the signal Snarrow to that of the signal Sx, the filter 30 also adjusts the amplitudes of the signal Sx such that the ratio of the original signal Snarrow to the signal Sx is 3:1. The signal Scf output from the filter 30 is input to the adder 7.

The adder 7 adds the signal Scf to the original signal Snarrow to thereby restore the signal having the frequency band ranging from 0 Hz to 8,000 Hz. The resulting sum signal is fed to the digital-to-analog converter 2. The digital-to-analog converter 2 converts the digital sum signal to an analog signal Swide.

Originally, the human voiced-sound component diminishes more as frequency becomes higher. Therefore, the illustrative embodiment utilizes the filter 30 in order to realize more natural sound signals than the band-pass filter 20, FIG. 4.

Figure 8:
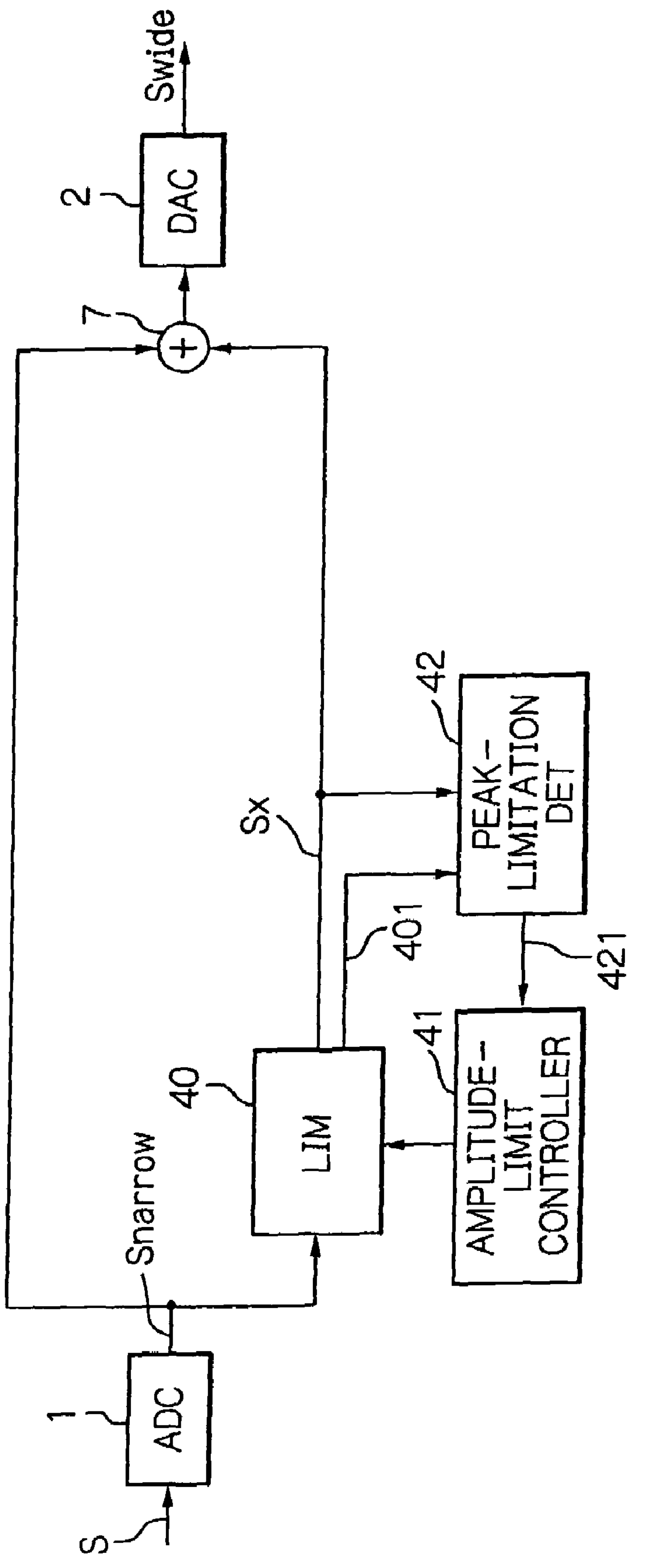

Referring to FIG. 8, a fourth embodiment of the band recovering device in accordance with the present invention will be described. The fourth embodiment is like the first embodiment except for the following. As shown, an amplitude limiter 40 and an amplitude-limit controller 41 are substituted for the peak-limiting amplifier 3 and amplification controller 4, FIG. 1, respectively. Also, a peak-limitation detector 42 is substituted for the peak-limitation detector 7, FIG. 1. Further, the attenuator 5, FIG. 1, is absent from the circuitry of FIG. 8.

The amplitude limiter 40, corresponding to a so-called limiter circuit, limits the amplitudes of the signal Snarrow output from the analog-to-digital converter 1 by using an amplitude limit value, which is controlled by the amplitude limit controller 41. The amplitude limit value refers to a limit value that is initially representative of the maximum amplitude and is then reduced by the amplitude-limit controller 41 in order to detect the maximum value of the signal Sx.

The peak-limitation detector 42, provided with a preselected amplitude restriction value beforehand, determines, for every preselected period of time, for example, every second, every frame, or every fifty thousand samples, whether or not the amplitude, for example, the maximum or the average, of the signal Sx output from the amplitude limiter 40 is coincident with the amplitude restriction value. If the maximum amplitude is short of the amplitude restriction value during any preselected period of time, then the peak-limitation detector 42 reduces the amplitude restriction value until it detects the maximum value. On detecting the maximum value, the detector 42 feeds a signal 421 representative of the detection to the amplitude-limit controller 41.

The amplitude-limit controller 41 controls the amplitude limit value assigned to the amplitude limiter 40. More specifically, when the signal 421 input from the peak-limitation detector 42 indicates that the amplitude of the signal Sx has reached the amplitude restriction value, the amplitude-limit controller 41 reduces the amplitude limit value of the amplitude limiter 40 to, e.g., 60% to 70% of the amplitude restriction value. While the amplitude limiter 40 is limiting the amplitudes, it sends a signal 401 representative of the limiting operation to the peak-limitation detector 42, causing the detector 42 to interrupt the detection of the maximum value.

The operation of the illustrative embodiment will be described hereinafter. The analog-to-digital converter 1 operates in exactly the same manner as in the first embodiment. The signal Snarrow output from the analog-to-digital converter 1 is input to the amplitude limiter 40.

The amplitude limiter 40 uses the amplitude limit value set by the amplitude-limit controller 41 to limit the amplitudes of the signal Snarrow. More specifically, digital maximum amplitudes of +32767 and −32768 to be output from the analog-to-digital converter 1 are initially set in the amplitude limiter 40 as a positive and a negative maximum amplitude, respectively. The amplitude limiter 40 therefore does not limit the amplitudes of the signal Snarrow at the initial stage of operation.

Comparing the signal Snarrow to amplitude limit values, the amplitude limiter 40 outputs the amplitude limit value instead of the signal Snarrow as the signal Sx only when the signal Snarrow is greater than the amplitude limit value. The amplitude limiter 40 delivers the signal 401 representative of the limiting operation to the peak-limitation detector 42. When the signal Snarrow is smaller than the amplitude limit value, the amplitude limiter 40 simply outputs the signal S narrow as the signal Sx.

On receiving the signal Sx from the amplitude limiter 40, the peak-limitation detector 42 determines, only when the amplitude is not limited, whether or not the amplitude of the signal Sx is coincident with the maximum value. If the amplitude of the signal Sx is coincident with the maximum value, then the detector 42 delivers the signal 421 representative of the coincidence and the amplitude restriction value to the amplitude limit controller 41.

The amplitude limit controller 41 sets an amplitude limit value for the amplitude limiter 40 in accordance with the signal 421 and amplitude restriction value and then feeds the amplitude limit value to the amplitude limiter 40. Consequently, the amplitude limiter 40 limits the amplitudes of the signal Snarrow in accordance with the amplitude limit value without fail, generating the frequency components of voice signal missing in the signal Snarrow. The digital-to-analog converter 2 operates in exactly the same manner as in the first embodiment.

The attenuator 5 shown in FIG. 1 may, of course, be connected between the adder 7 and the amplitude limiter 40 although not shown in FIG. 8.

As stated above, in the illustrative embodiment, the amplitude limiter 40 limits the amplitudes of a voice signal to generate high-frequency components. The amplitude limit controller 41 controls, in accordance with the output of the peak-limitation detector 42 responsive to the maximum value, the amplitude limit value of the amplitude limiter 40 such that the amplitudes of the voice signal are limited without fail. With this configuration, the illustrative embodiment not only enhances sound signal quality by recovering the missing high-frequency components of a voice signal like the first embodiment, but also scales down the circuitry because the attenuator 5 of the first embodiment is absent.

Figure 9:
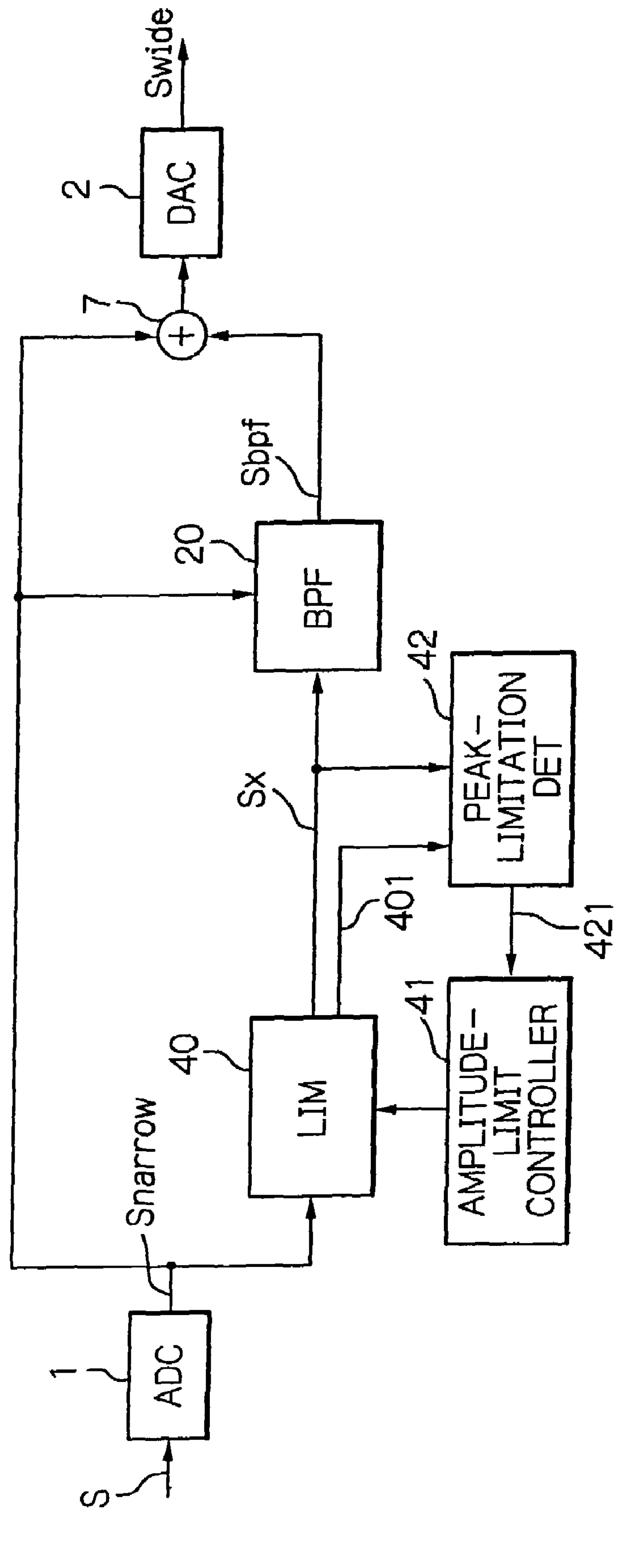

FIG. 9 shows a fifth embodiment of the band recovering device in accordance with the present invention. As shown, the fifth embodiment is like the fourth embodiment except that the band-pass filter 20 is connected between the amplitude limiter 40 and the adder 7. The band-pass filter 20 operates in the same manner as the band-pass filter 20 of the second embodiment.

As stated above, with the band-pass filter 20 added to the circuitry of the fourth embodiment, the illustrative embodiment recovers the band by using only frequency components necessary for recovery while leaving the other frequency components, which should not be enhanced, as they are. The illustrative embodiment therefore improves sound signal quality more than the fourth embodiment.

Figure 10:
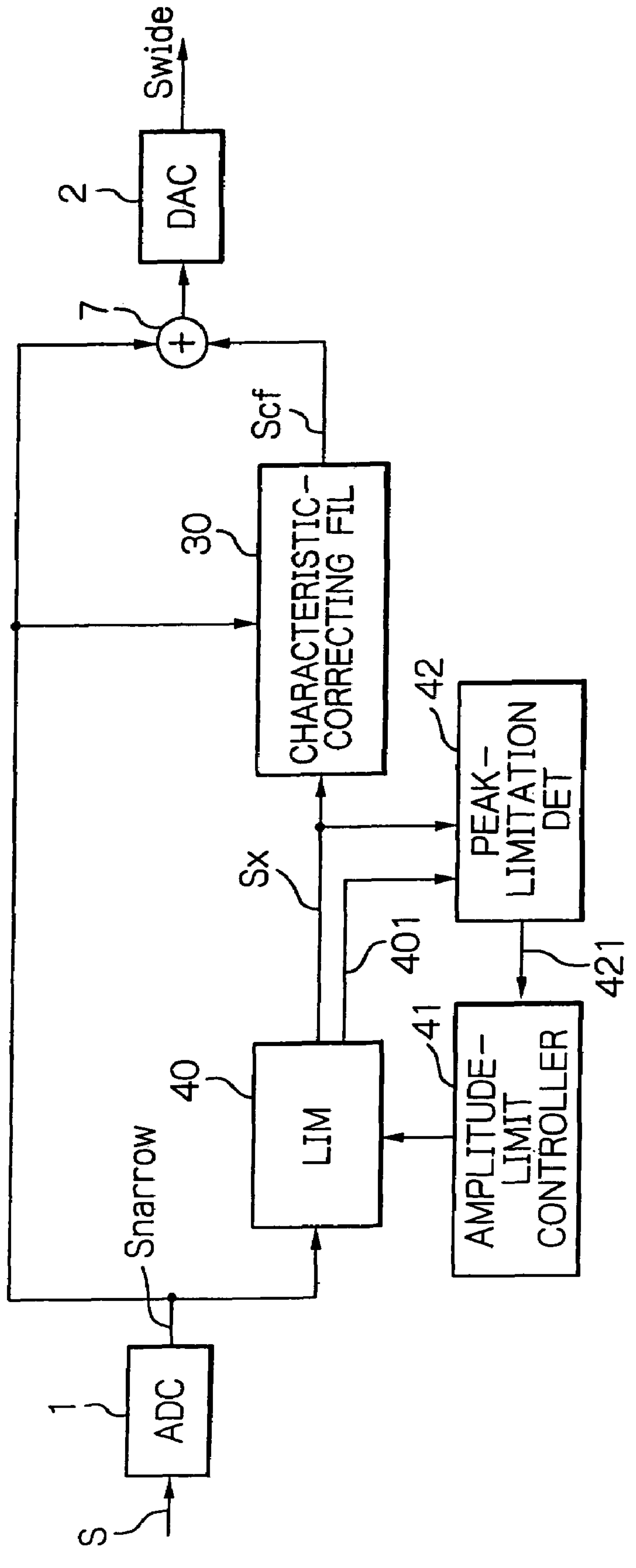

FIG. 10 shows a sixth embodiment of the band recovering device in accordance with the present invention. As shown, the sixth embodiment is like the fifth embodiment except that the characteristic correcting filter 30 is substituted for the band-pass filter 20. The characteristic correcting filter 30 operates in the same manner as the characteristic correcting filter 30 of the third embodiment.

It will be seen that using the characteristic correcting filter 30 instead of the band-pass filter 20, the illustrative embodiment allows a voice signal to sound more natural than the fifth embodiment.

Figure 11:
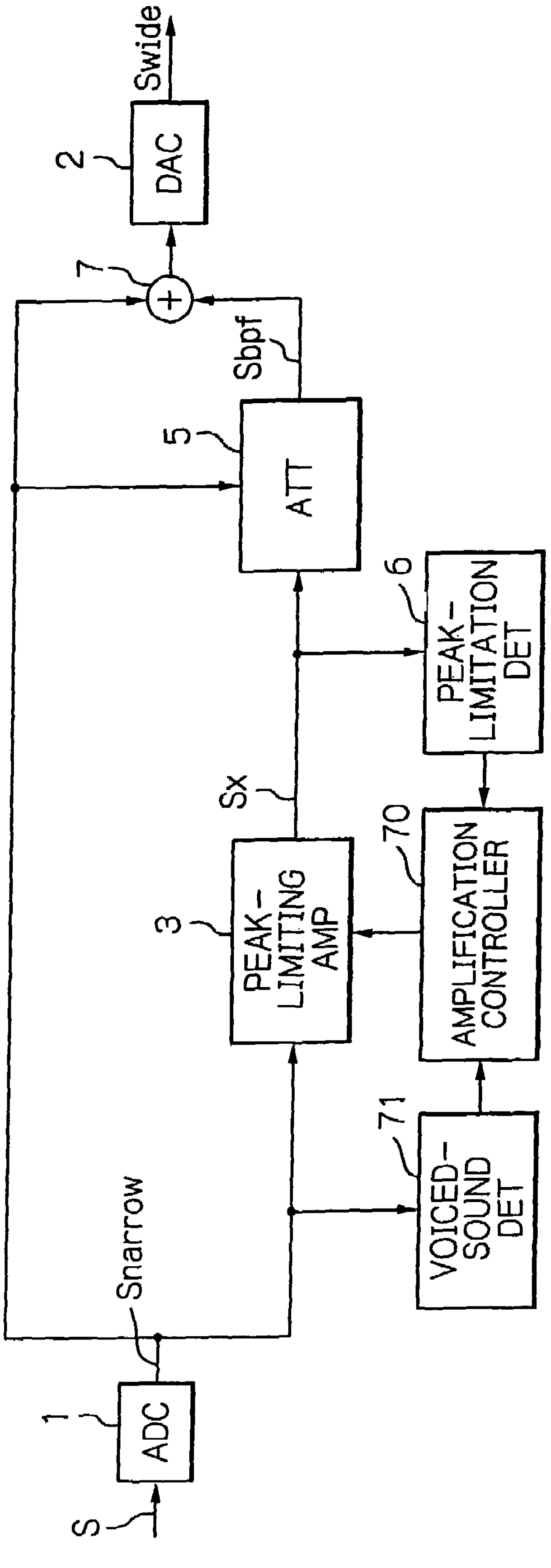

Reference will be made to FIG. 11 for describing a seventh embodiment of the band recovering device in accordance with the present invention. As shown, the seventh embodiment is similar to the first embodiment except that a voiced-sound detector 71 is connected to the output of the analog-to-digital converter 1 and that an amplification controller 70 is substituted for the amplification controller 4.

In the illustrative embodiment, the voiced-sound detector 71 determines whether or not the signal Snarrow output from the analog-to-digital converter 1 includes a voiced sound signal and delivers, on detecting a voiced sound signal, the result of detection to the amplification controller 70. In response, the amplification controller 70 increases the amount of amplification of the peak-limiting amplifier 3 as long as the voiced-sound detector 71 is detecting the voiced sound signal. The amplification controller 70 continuously increases the amount of amplification until it receives the output of the peak-limitation detector 6 representative of the maximum value.

The operation of the illustrative embodiment will be described more specifically hereinafter. The voiced-sound detector 71 determines, with a method to be described later specifically, whether or not the signal Snarrow output from the analog-to-digital converter 1 includes a voiced sound signal If the signal Snarrow includes a voiced sound signal, then the voiced-sound detector 71 reports the detection of a voiced sound signal to the amplification controller 70. In response, the amplification controller 70 increases the amount of amplification of the peak-limiting amplifier 3 and continuously increases it as long as the voiced-sound detector 71 is detecting the voiced sound signal. Subsequently, as soon as the peak-limitation detector 6 continuously detects the maximum value, the amplification controller 70 stops increasing the amount of amplification.

The peak-limiting amplifier 3 and peak-limitation detector 6 operate in the same manner as in the first embodiment.

The voiced-sound detector 71 is significant in that the band recovery of the illustrative embodiment should preferably be continued throughout the duration of a voiced sound signal. This is because the illustrative embodiment is particularly effective for voiced sound signal, as stated above. More specifically, it is more preferable to recover a voice signal throughout the duration of a voiced sound signal than to recover the band of only part of the voice signal.

How the voiced-sound detector 71 detects a voiced sound signal will be described in detail hereinafter. The voiced-sound detector 71 calculates two different kinds of mean values Lng_S_narrow and Srt_S_narrow of the signal Snarrow, which are different in time constant from each other. These mean values are expressed as:

$$Lng\_S\_\text{narrow}(k)=\delta 1\cdot Lng\_S\_\text{narrow}(k-1)+(1.0-\delta 1)|S\text{narrow}(k)| \quad (1)$$

$$Srt\_S\_\text{narrow}(k)=\delta 2\cdot Srt\_S\_\text{narrow}(k-1)+(1.0-\delta 2)|S\text{narrow}(k)| \quad (2)$$

where k denotes a serial integer corresponding to the analog signal sampling time, and δx (=1, 2) denotes a constant representative of the smoothness of a mean value, i.e., a rough signal level and lying in the range of 1≧δx≧0. The larger the constant δx, the more smooth the mean value. With a small constant δx, it is possible to cope with the sharp variation of the signal. In the illustrative embodiment, δ1 and δ2 are selected to be 0.99 and 0.5, respectively.

The illustrative embodiment regards the mean values Lng_S_narrow(k) and Srt_S_narrow as a noise floor level and a signal level, respectively, and determines that a voiced sound signal is present when the following relation holds:

$$Srt\_S\_\text{narrow}(k)>Lng\_S\_\text{narrow}(k)+6\text{ dB} \quad (3)$$

It should be noted that the threshold of 6 dB included in the relation (3) is not restrictive, but is only illustrative.

As stated above, with the voiced-sound detector 71 added to the circuitry of the first embodiment, the illustrative embodiment causes the amplification controller 70 to control the amount of amplification in accordance with whether or not a voiced sound signal is present, thereby continuously generating a band-recovered signal throughout the duration of a voiced sound signal. The illustrative embodiment therefore enhances sound signal quality over the entire voiced portions of conversation.

Figure 12:
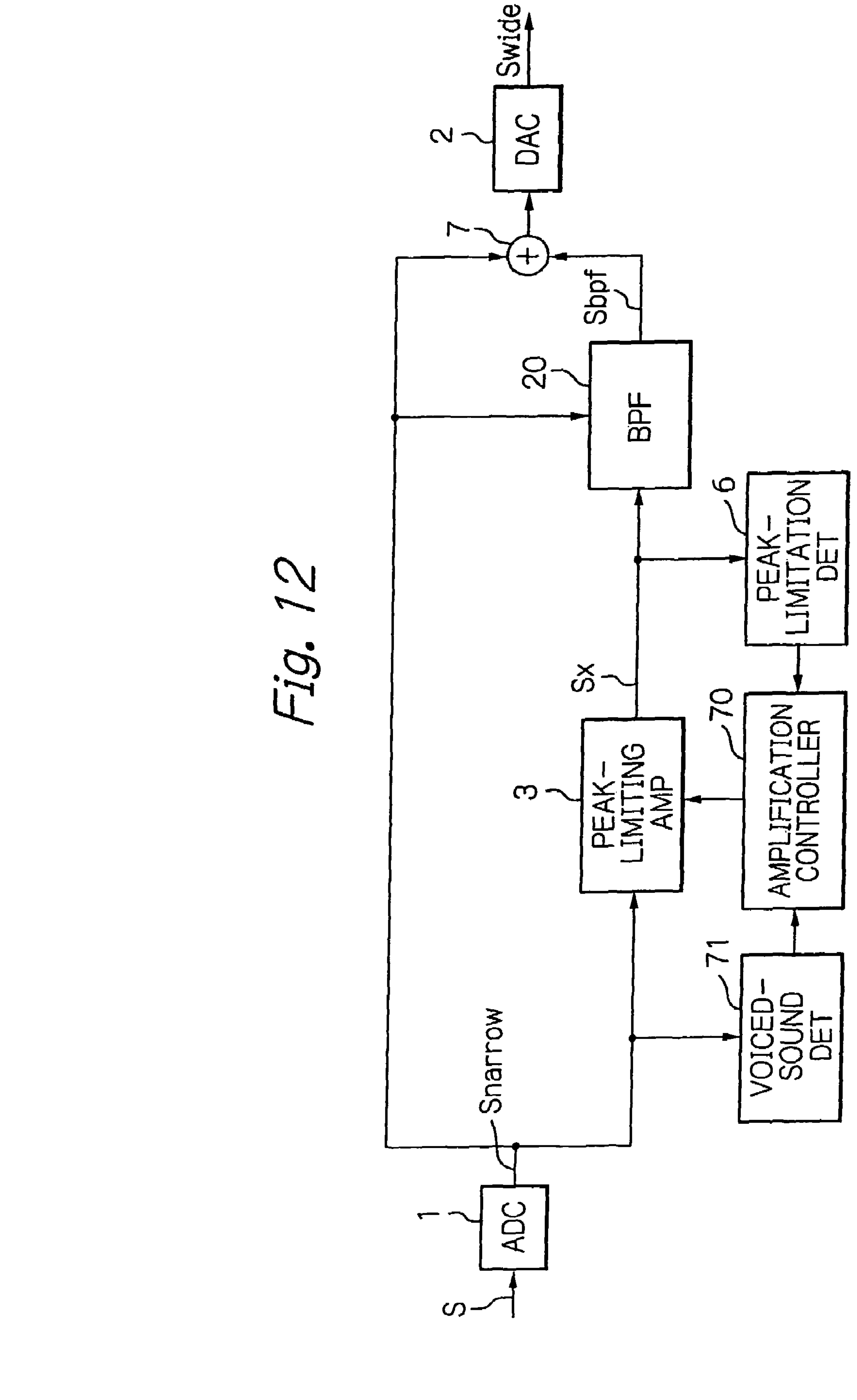

FIG. 12 shows an eighth embodiment of the band recovering device in accordance with the present invention. As shown, the eighth embodiment is like the seventh embodiment except that the band-pass filter 20 is substituted for the attenuator 5. Again, the band-pass filter 20 operates in the same manner as the band-pass filter 20 of the second embodiment.

With the band-pass filter 20 substituted for the attenuator 5, the illustrative embodiment recovers the missing band by using only frequency components necessary for recovery while leaving the other frequency components, which should not be enhanced, as they are. The illustrative embodiment therefore improves sound signal quality more than the seventh embodiment.

Figure 13:
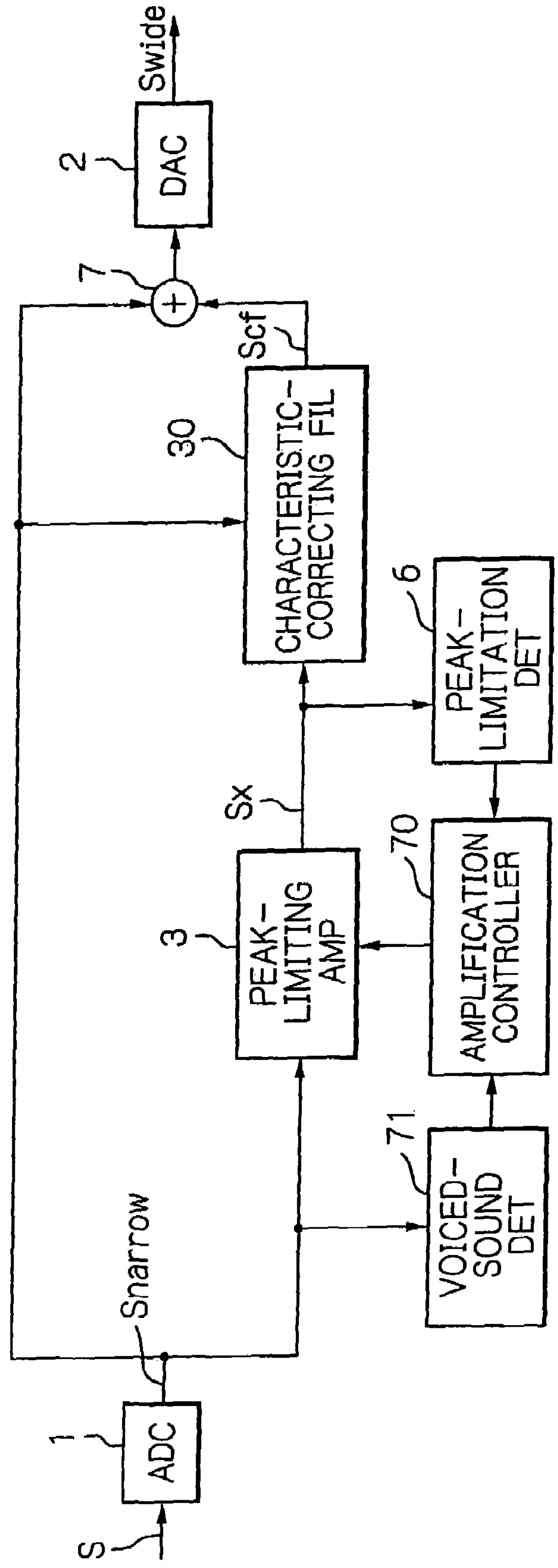

FIG. 13 shows a ninth embodiment of the band recovering device in accordance with the present invention. As shown, the ninth embodiment is like the eighth embodiment except that the characteristic correcting filter 30 is substituted for the band-pass filter 20. The characteristic correcting filter 30 operates in the same manner as the characteristic correcting filter 30 of the third embodiment.

It will be seen that using the characteristic correcting filter 30 instead of the band-pass filter 20, the illustrative embodiment allows the voice signal to sound more natural than the eighth embodiment.

Figure 14:
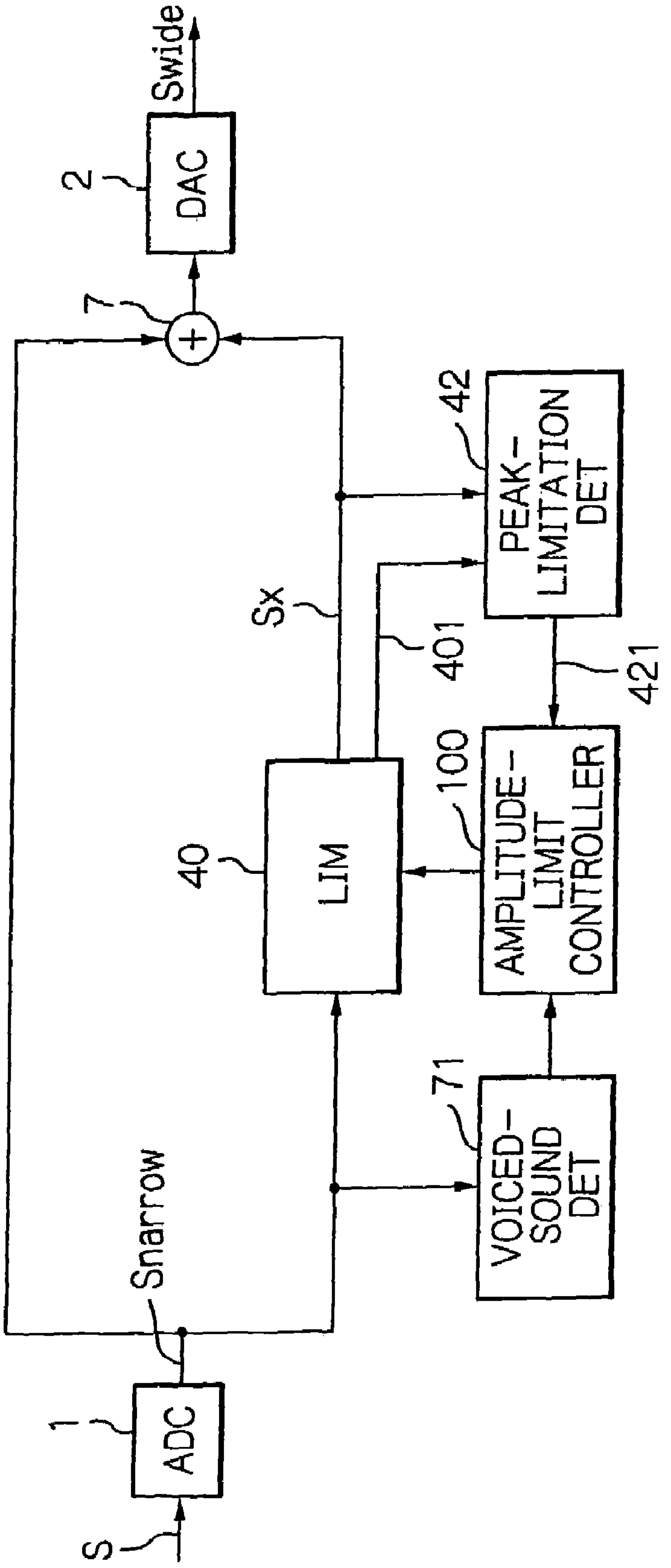

FIG. 14 shows a tenth embodiment of the band recovering device in accordance with the present invention. As shown, the tenth embodiment is like the fourth embodiment except that the voiced-sound detector 71 is connected to the output of the analog-to-digital converter 1 and that an amplitude-limit controller 100 is substituted for the amplitude-limit controller 41. The voiced-sound detector 71 operates in exactly the same manner as in the seventh embodiment.

In the illustrative embodiment, when the output of the voiced-sound detector 71 indicates the detection of a voiced sound signal, the amplitude-limit controller 100 reduces, throughout the duration of the voiced sound signal, the amplitude limit value until the maximum value has been continuously detected, thereby limiting the tops of the signal.

The voiced-sound detector 71 is significant for the same reason as described in relation to the seventh embodiment.

As stated above, with the voiced-sound detector 71 added to the circuitry of the fourth embodiment, the illustrative embodiment causes the amplitude-limit controller 100 to control the amplitude limit value of the amplitude limiter 40 such that amplitude limitation occurs throughout the duration of a voiced sound signal, which is detected by the voiced-sound detector 71. This successfully generates a band-recovered signal throughout the duration of a voiced sound signal and therefore continuously enhances sound signal quality throughout the voiced portions of conversation.

Figure 15:
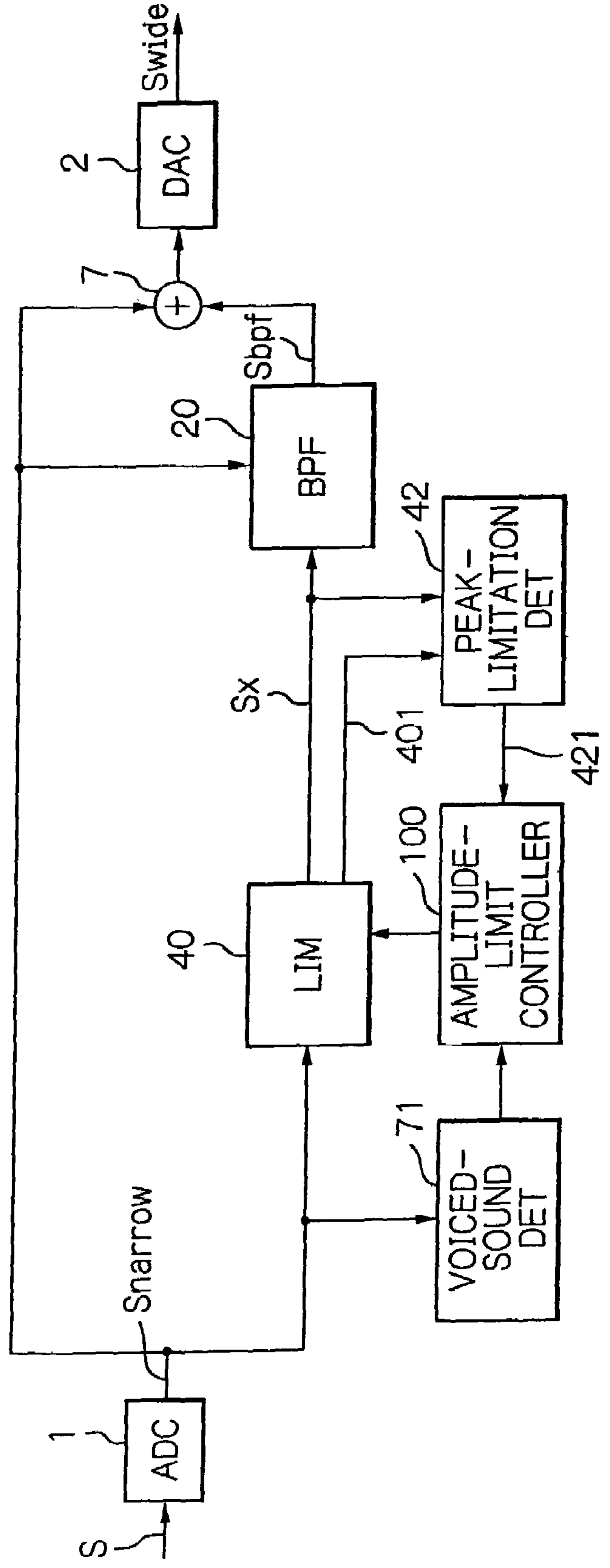

FIG. 15 shows an eleventh embodiment of the band recovering device in accordance with the present invention. As shown, the eleventh embodiment is like the tenth embodiment except for the addition of the band-pass filter 20. The band-pass filter 20 operates in exactly the same manner as described in relation to the second embodiment.

With the band-pass filter 20 added to the circuitry of the tenth embodiment, the illustrative embodiment recovers the band by using only frequency components necessary for recovery while leaving the other frequency components, which should not be enhanced, as they are. The illustrative embodiment therefore enhances sound signal quality more than the tenth embodiment.

Figure 16:
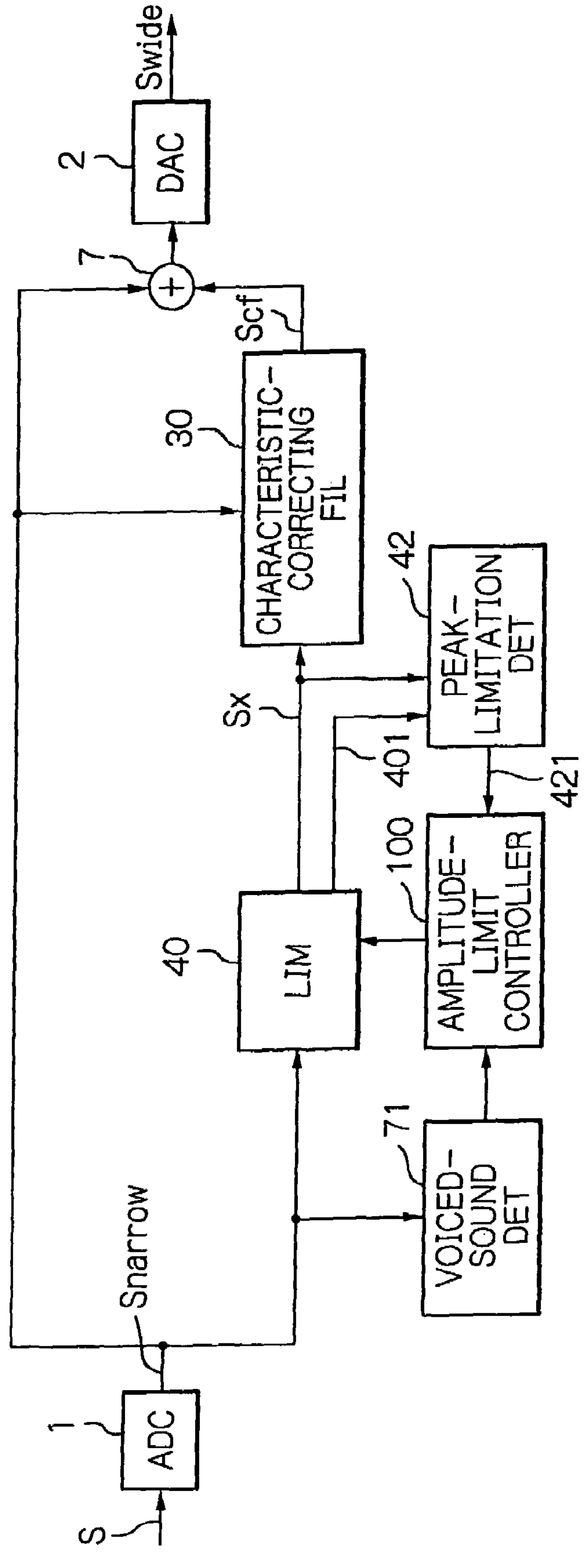

FIG. 16 shows a twelfth embodiment of the band recovering device in accordance with the present invention. As shown, the twelfth embodiment is like the eleventh embodiment except that the characteristic correcting filter 30 is substituted for the band-pass filter 20. The characteristic correcting filter 30 operates in exactly the same manner as described in relation to the third embodiment.

It will be seen that the illustrative embodiment, using the characteristic correcting filter 30, makes a voice sound signal natural more than the eleventh embodiment.

Figure 17:
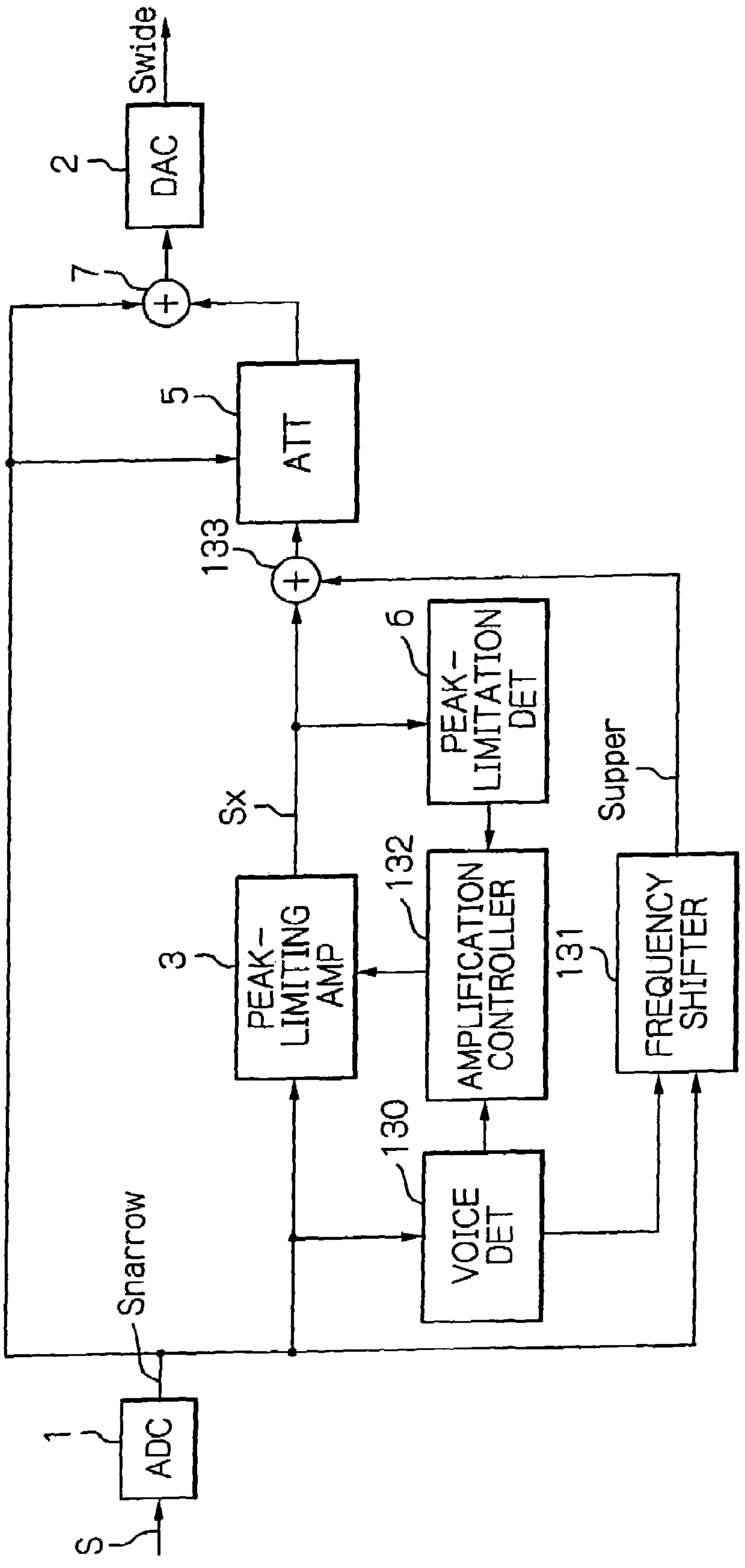
FIGS. 18 through 17 are schematic block diagrams showing through thirteenth embodiments of the band recovering device in accordance with the present invention.

A thirteenth embodiment of the band recovering device in accordance with the present invention will be described with reference to FIG. 17 hereinafter. As shown, the thirteenth embodiment is like the seventh embodiment except that a voice detector 130 is substituted for the voiced-sound detector 71, that a frequency shifter 131 is added, and that an amplification controller 132 is substituted for the amplification controller 70.

The voice detector 130 detects a voiced and an unvoiced sound signal present in the signal Snarrow output from the analog-to-digital converter 1 and delivers a signal representative of the detection to the amplification controller 132 and frequency shifter 131. How the voice detector 130 detects a voiced and an unvoiced sound signal will be described in detail later.

When the output of the voice detector 130 indicates the detection of an unvoiced or voiceless sound signal, the frequency shifter 131 shifts the frequency of the signal Snarrow output from the analog-to-digital converter 1 toward the band to be restored. However, the frequency shifter 131 does not shift the frequency when the output of the voice detector 130 indicates the detection of a voiced sound signal.

On receiving the output of the voice detector 130 representative of the detection of an unvoiced sound signal, the amplification controller 132 controls the amount of amplification of the peak-limiting amplifier 3 to one time. On the other hand, when the output of the voice detector 130 indicates the detection of a voiced sound signal, the amplification controller 132, like the amplification controller 70 of the seventh embodiment, increases the above amount over the duration of the voiced sound signal and continuously increases it until the maximum value detector 6 detects the maximum value.

In operation, the voice detector 130 receives the signal Snarrow whose frequency band is confined in the range of, e.g., from 0 Hz to 4,000 Hz. The voice detector 130 first detects a voiced sound signal in the same manner as the voiced-sound detector 71 of the seventh embodiment and detects an unvoiced sound signal with the following procedure.

Figure 18:
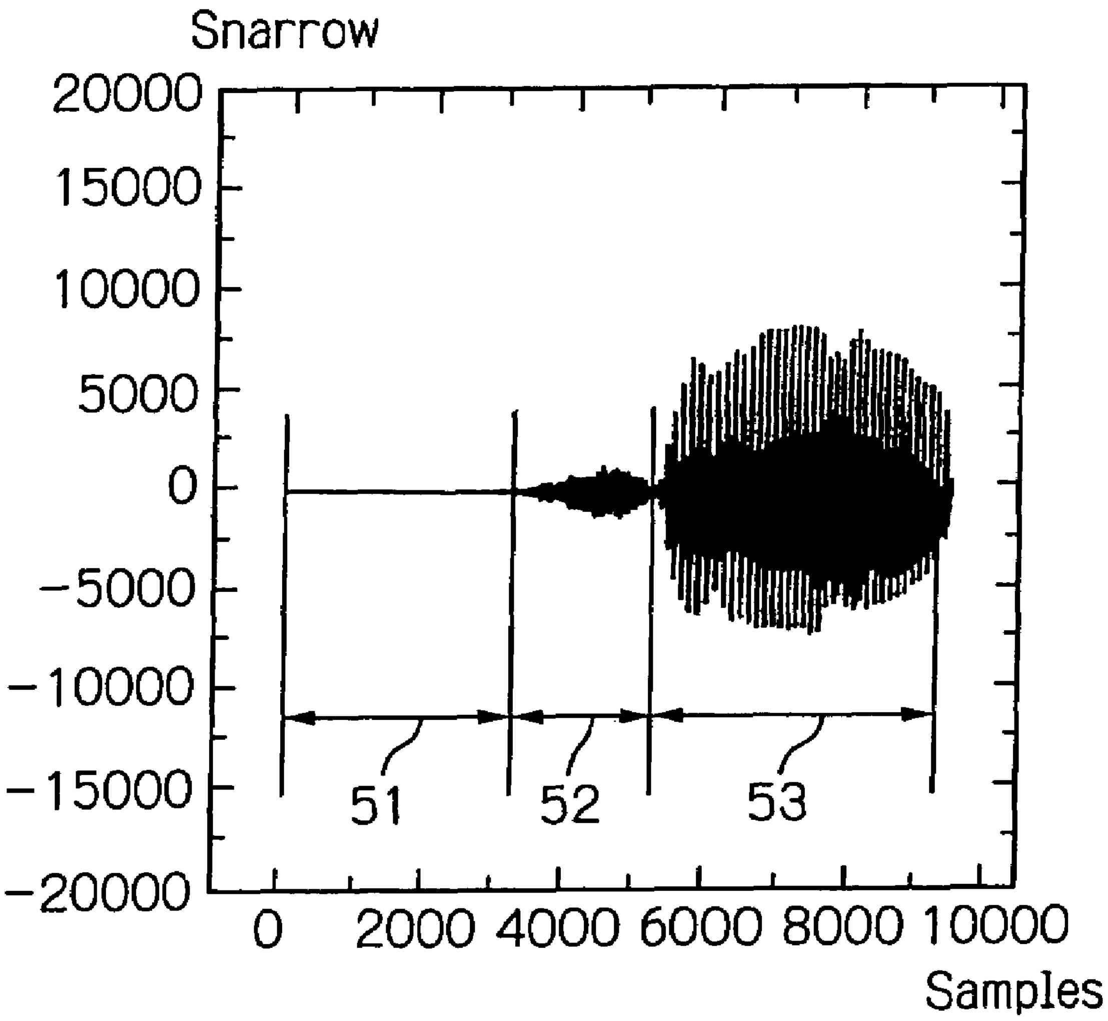

FIG. 18 plots a specific waveform of the signal Snarrow input to the voice detector 130 and representative of a Japanese voice "shou". In FIG. 18, the ordinate and abscissa indicate the strength of a voice signal in digital value and a serial integer corresponding to the analog signal sampling time, respectively. As shown, there is not a signal in a time section 51, and an unvoiced sound "sh" and a voiced sound "ou:" are present in time sections 52 and 53, respectively. The amplitude of the unvoiced sound "sh" is small, but wave form varies across the horizontal axis, i.e., an amplitude of 0. To detect an unvoiced sound signal, the voice detector 130 determines how many times a digital sample of the signal Snarrow crosses the horizontal axis or amplitude 0.

More specifically, the voice detector 130 calculates a product cross_S_narrow(k) of a sample sequence Snarrow(k) of the signal Snarrow and a sample sequence (Snarrow) (k−1) immediately preceding it:

$$cross\_Snarrow(k)=Snarrow(k)\times Snarrow(k-1) \quad (4)$$

Subsequently, when the sign of the product cross_Snarrow (k) is minus or negative, i.e., when the data sample crosses the horizontal axis or zero, the voice detector 130 increments a counter c_consonant by 1.

The voice detector 130 repeats the expression (4) with the past 1,600 samples Snarrow (k-1, 599) to Snarrow (k) and determines, if more than four hundred of them cross the horizontal axis, that an unvoiced sound signal is present:

$$c_{13}consonant>400 \quad (5)$$

While the number of past samples and the threshold of the relation (5) are respectively assumed to be 1, 600 and 400, such numerical values are, of course, only illustrative. Also, an unvoiced sound signal may be detected by any suitable method other than one using the number of zero-crossing points described above.

The voice detector 130 finally determines the kind of a voice signal on the basis of the result of detection of voiced and unvoiced sound signals, as follows:

(1) If neither a voiced sound signal nor an unvoiced sound signal is detected, then a voice signal is absent;

(2) If a voiced sound signal is not detected, but an unvoiced sound signal is detected, then an unvoiced sound signal is present;

(3) If a voiced sound signal is detected, but an unvoiced sound signal is not detected, then a voiced sound signal is present; or (4) If a voiced sound signal and an unvoiced sound signal both are detected, then a voiced sound signal is present.

While the illustrative embodiment uses the above classification, any other suitable method may be used so long as it can correctly detect voice signals while distinguishing voiced sound signals from unvoiced sound signals.

The result of detection of a voiced/unvoiced sound signal is fed from the voice detector 130 to the amplification controller 132 and frequency shifter 131. The amplification controller 132 and frequency shifter 131 operate in accordance with the result of detection, as will be described hereinafter.

When the output of the voice detector 130 is representative of the result of decision (1), i.e., when no voice signal is detected, the amplification controller 132 controls the amount of amplification of the peak-limiting amplifier 3 to unity.

Also, when the output of the voice detector 130 is representative of the result of decision (2), i.e., when an unvoiced sound signal is detected, the amplification controller 132 controls the amount of amplification of the peak-limiting amplifier 3 to unity. The frequency shifter 131 also shifts the frequency of the input signal Snarrow toward the band to be restored. More specifically, in the illustrative embodiment, the frequency shifter 131 multiplies the signal Snarrow whose frequency ranges from 0 Hz to 4,000 Hz by a 4,000 Hz sinusoidal wave, thereby outputting a signal Supper lying in the frequency range of 4,000 Hz to 8,000 Hz. Of course, any other suitable method may be used so long as it shifts the frequency components toward the band to be restored.

The signal Supper thus shifted in frequency is added to the signal Sx by an adder 133 and then input to the attenuator 5. The resulting output of the attenuator 5 is further added to the original signal Snarrow and then output via the digital-to-analog converter 2 as a signal Swide.

On the other hand, when the output of the voice detector 130 is representative of the result of decision (3) or (4), i.e., when a voiced sound signal is detected, the frequency shifter 131 does not operate. In this case, the voice detector 130 operates in the same manner as the voice detector 71 of the seventh embodiment. Also, the amplification controller 132 operates in the same manner as the amplification controller 70 of the seventh embodiment.

As stated above, the thirteenth embodiment recovers not only frequency components representative of voiced sound signals but also frequency components representative of unvoiced sound signals, thereby enhancing sound signal quality more than the seventh embodiment.

Because human voice signals, of course, include both of voiced and unvoiced sound signals, frequency components representative of both of them should preferably be recovered for enhancing sound signal quality. On the other hand, an unvoiced sound signal does not have a waveform made up of the first fundamental frequency and integral multiples thereof described in relation to the first embodiment. It follows that even when the 0 Hz to 4,000 Hz signal Snarrow is added to the 4,000 Hz to 8,000 Hz signal Supper produced by shifting the signal Snarrow upward, the resulting 0 Hz to 8,000 Hz signal does not sound unnatural. This is why the thirteenth embodiment recovers frequency components representative of unvoiced sound signals as well.

As stated above, in the illustrative embodiment, when a voice signal is unvoiced, the frequency shifter 131 shifts the frequencies of the unvoiced sound signal to thereby recover a band. This is successful to recover a band representative of unvoiced sound signals as well for thereby further enhancing sound signal quality. While the illustrative embodiment processes both of voiced sound signals and unvoiced sound signals, it may process only unvoiced sound signals with the frequency shifter 131, if desired.

Figure 19:
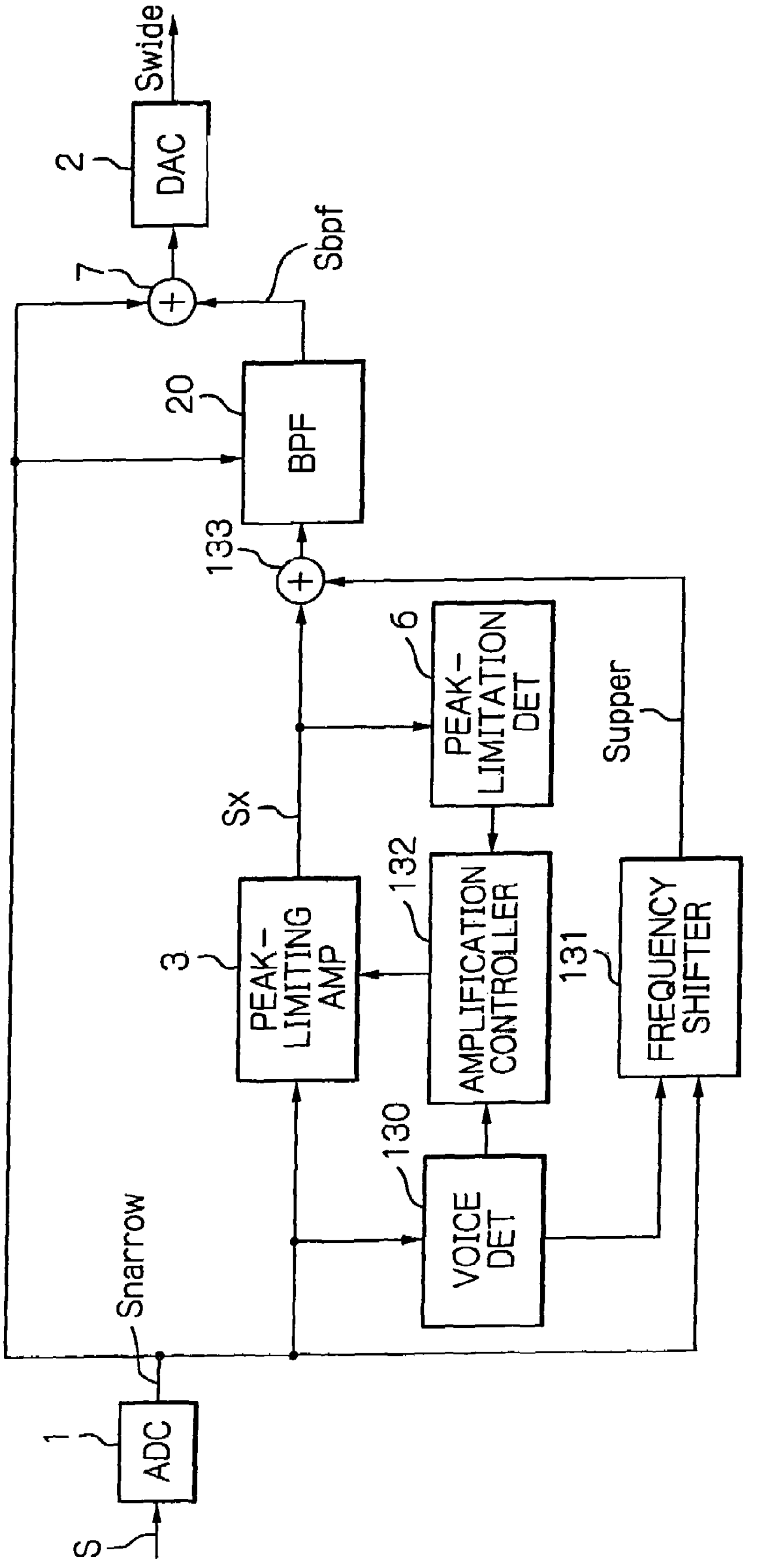
FIGS. 19 through 23 are schematic block diagrams showing through eighteenth embodiments of the band recovering device in accordance with the present invention.

FIG. 19 shows a fourteenth embodiment of the band recovering device in accordance with the present invention. As shown, the fourteenth embodiment is like the thirteenth embodiment except that the band-pass filter 20 is substituted for the attenuator 5. The band-pass filter 20 operates in the same manner as in the second embodiment and will not be described specifically.

With the band-pass filter 20 added to the circuitry of the thirteenth embodiment, the illustrative embodiment recovers the band by using only frequency components necessary for recovery while leaving the other frequency components, which should not be enhanced, as they are. The illustrative embodiment therefore enhances sound signal quality more than the thirteenth embodiment.

Figure 20:
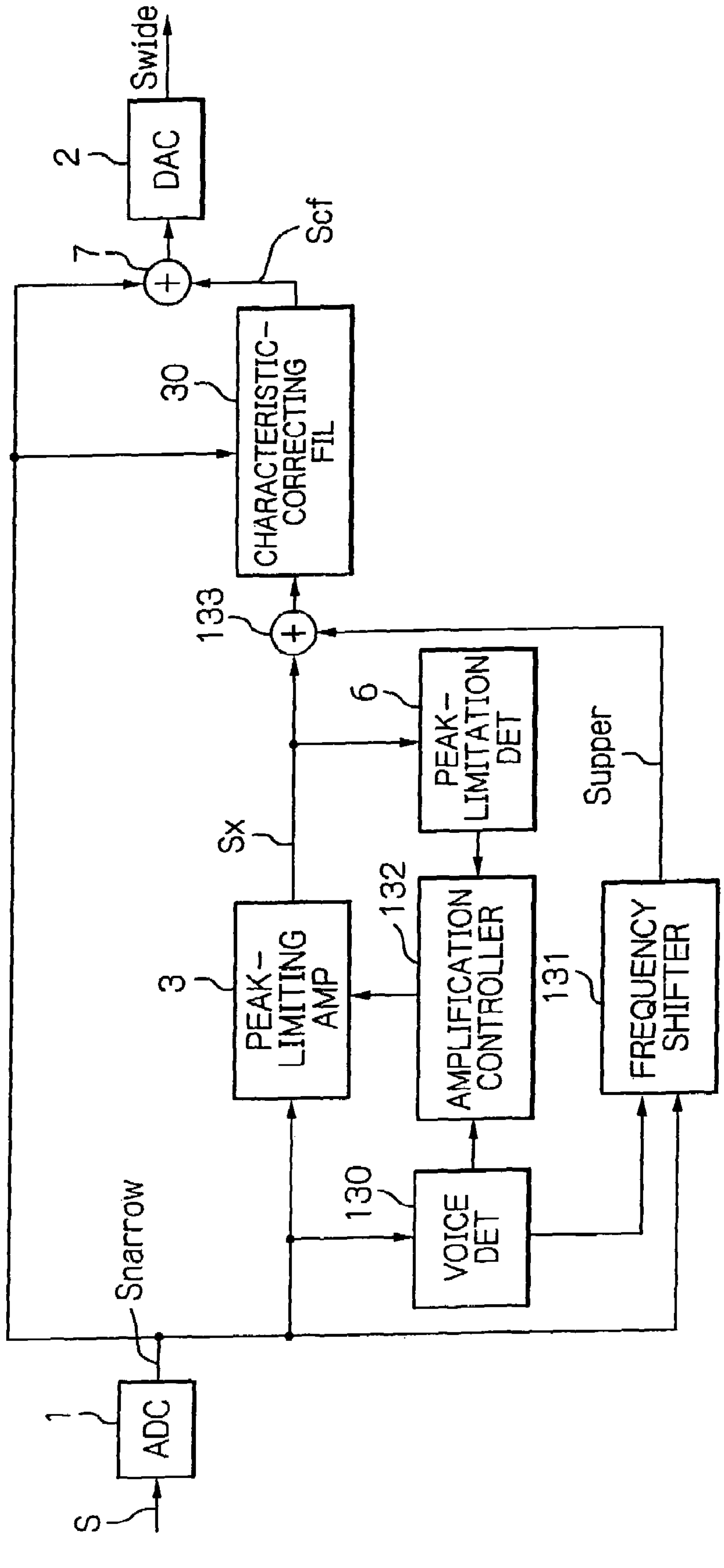

FIG. 20 shows a fifteenth embodiment of the band recovering device in accordance with the present invention. As shown, the fifteenth embodiment is like the fourteenth embodiment except that the characteristic correcting filter 30 is substituted for the band-pass filter 20. The characteristic correcting filter 30 operates in the same manner as in the third embodiment and will not be described specifically.

It will be seen that the illustrative embodiment, using the characteristic correcting filter 30, makes voice sound signal more natural than the fourteenth embodiment.

Figure 21:
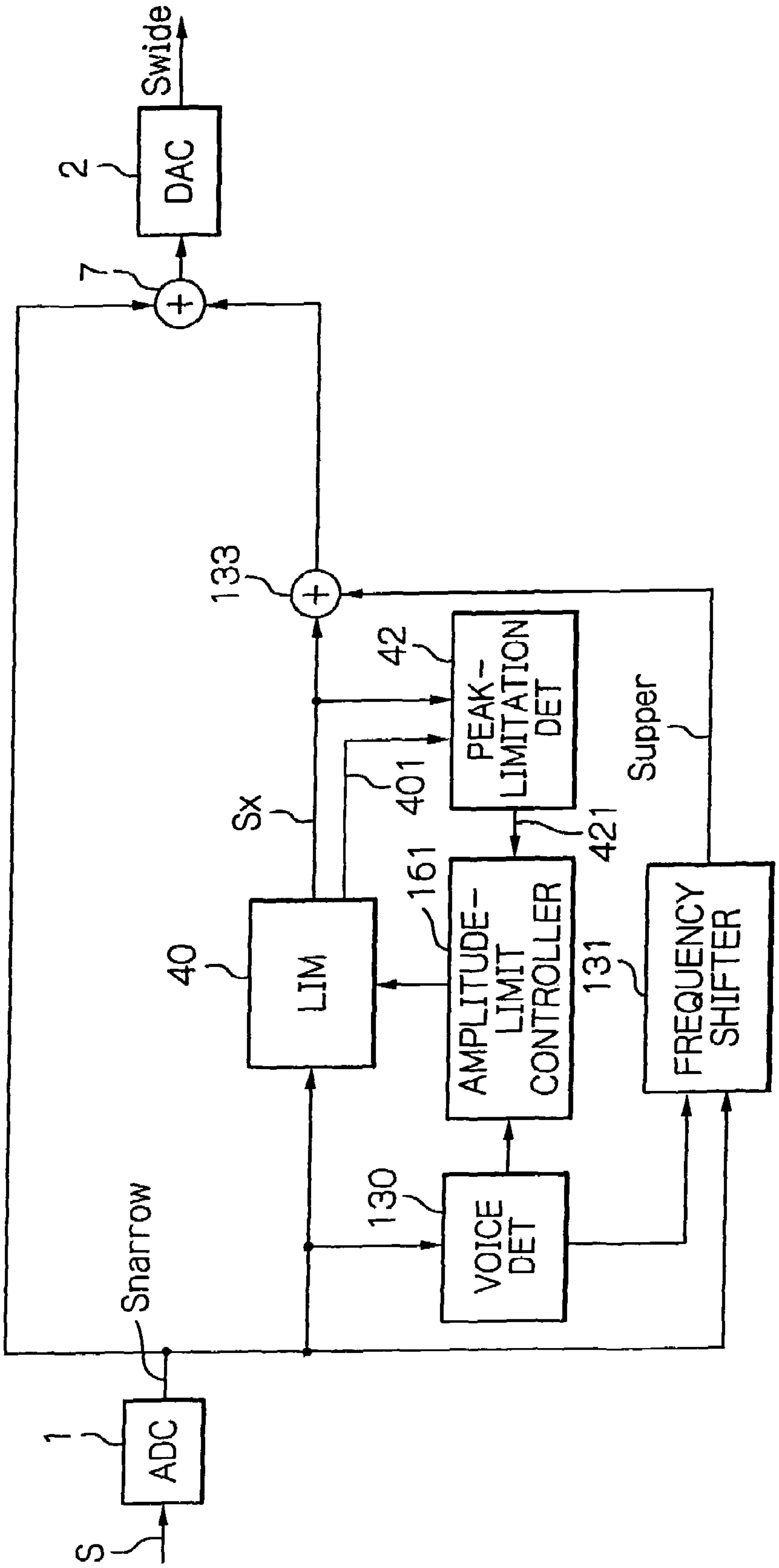

Reference will be made to FIG. 21 for describing a sixteenth embodiment of band recovering device in accordance with the present invention. As shown, the sixteenth embodiment is like the tenth embodiment except that the voice detector 130 is substituted for the voiced-sound detector 71, that an amplitude-limit controller 161 is substituted for the amplitude-limit controller 100, and that the frequency shifter 131 is present.

The voice detector 130 and frequency shifter 131 operate in the same manner as in the thirteenth embodiment. Let the following description concentrate on the operation of the amplitude-limit controller 161.

The amplitude-limit controller 161 controls the amplitude limit value of the amplitude limiter 40 in accordance with the output of the voice detector 130 representative of the decision on a voiced/unvoiced sound signal. If the output of the voice detector 130 indicates that no sound signal is present, then the amplitude-limit controller 161 fixes the amplitude limit value of the amplitude limiter 40. On the other hand, if the above output indicates that an unvoiced sound signal is present, then the amplitude-limit controller 161 maximizes the amplitude limit value of the amplitude limiter 40, i.e., does not limit the amplitude limit value as far as possible, thereby obviating a waveform with limited tops.

When the output of the voice detector 130 indicates that a voiced sound signal is present, the frequency shifter 131 does not operate. In this case, the voice detector 130 and amplitude-limit controller 161 respectively operate in the same manner as the voice detector 71 and amplitude-limit controller 100 of the tenth embodiment.

As stated above, in the illustrative embodiment, when a voice signal is unvoiced or voiceless, the frequency shifter 131 restored the frequency band of the unvoiced sound signal to thereby further enhance sound signal quality. In addition, the illustrative embodiment scales down the band recovering device more than the thirteenth embodiment because it does not need the attenuator 5.

Figure 22:
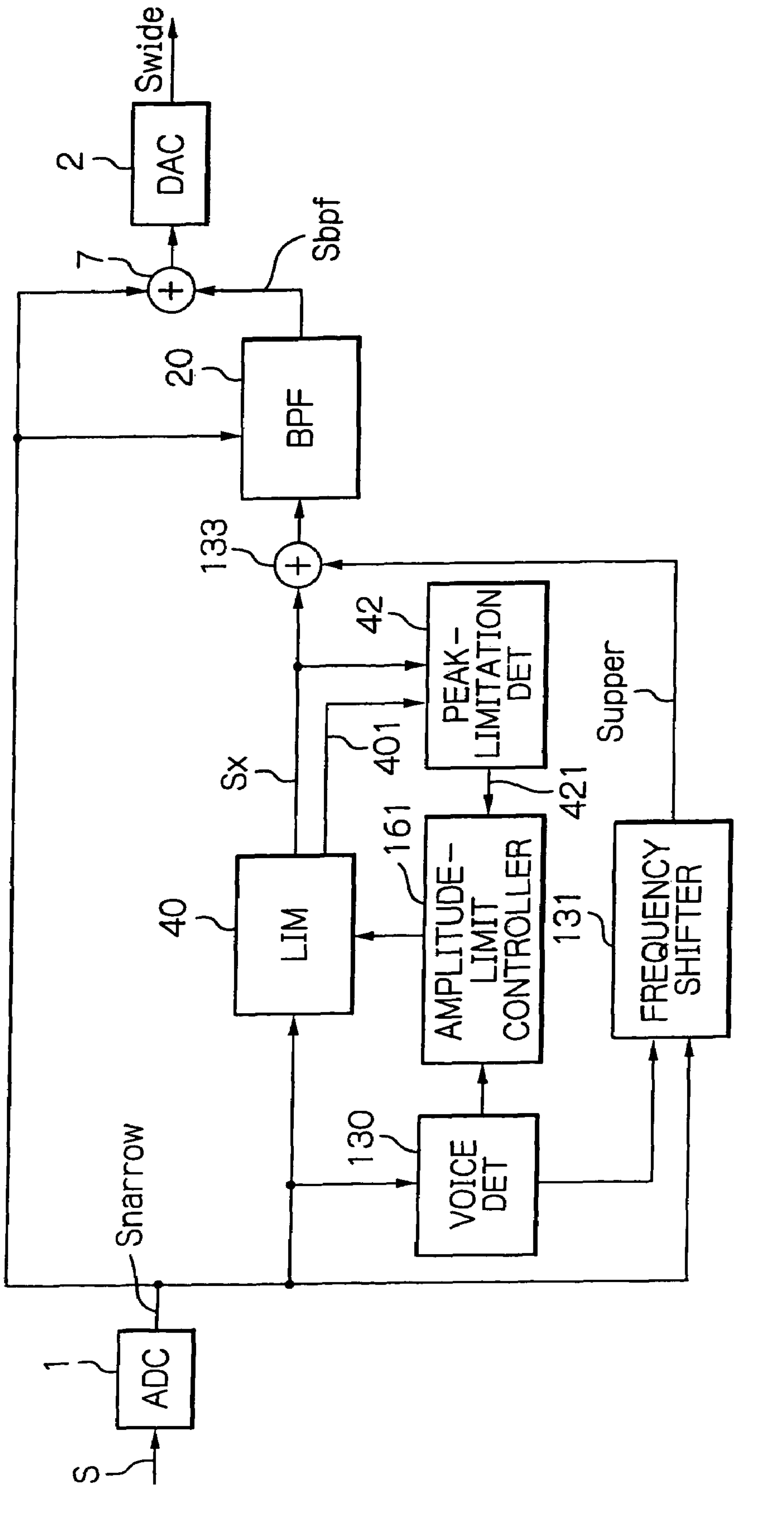

FIG. 22 shows a seventeenth embodiment of the band recovering device in accordance with the present invention. As shown, the seventeenth embodiment is like the sixteenth embodiment except for the addition of the band-pass filter 20. The band-pass filter 20 operates in the same manner as in the second embodiment.

With the band-pass filter 20 added to the circuitry of the sixteenth embodiment, the illustrative embodiment recovers the missing band by using only frequency components necessary for recovery while leaving the other frequency components, which should not be enhanced, as they are. The illustrative embodiment therefore enhances sound signal quality more than the sixteenth embodiment.

Figure 23:
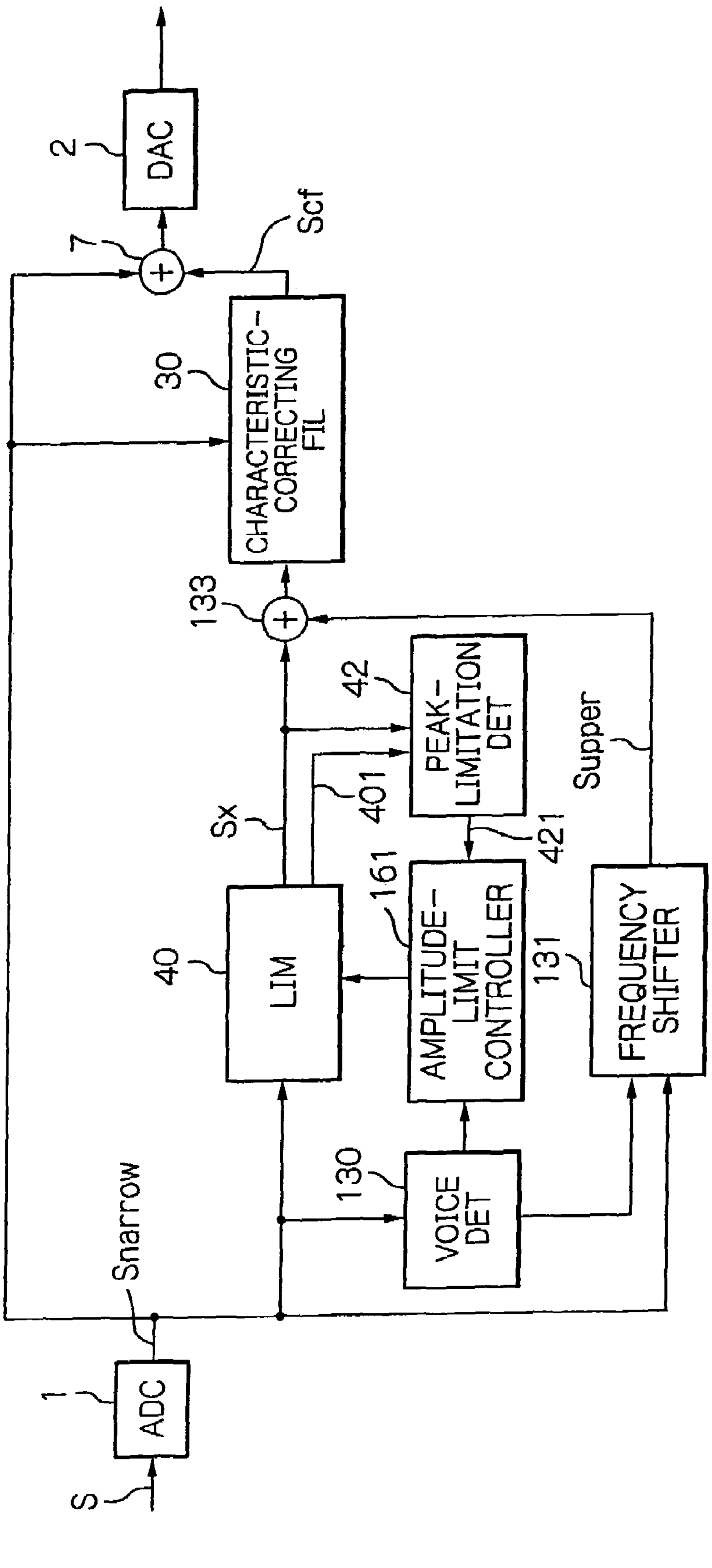

FIG. 23 shows an eighteenth embodiment of the band recovering device in accordance with the present invention. As shown, the eighteenth embodiment is like the seventeenth embodiment except that the characteristic correcting filter 30 is substituted for the band-pass filter 20. The characteristic correcting filter 30 operates in the same manner as in the third embodiment and will not be described specifically.

It will be seen that the illustrative embodiment, using the characteristic correcting filter 30, makes voice sound signal natural more than the fourteenth embodiment.

In the embodiments shown and described, to recover a missing band, a voice signal is processed to generate a signal with limited tops, i.e., a signal having a waveform resembling a rectangular waveform and made up of the first frequency, which is identical with the first basic frequency of the voice signal, and frequencies which are integral multiples thereof. Alternatively, the maximum and/or the minimum value of the voice signal may be linearly interpolated to thereby generate a triangular wave. Further, only the maximum or the minimum value of the voice signal may be used to linearly interpolate a portion between the horizontal axis and the next maximum value or the next minimum value, thereby generating a saw-tooth wave.

It should be noted that the illustrative embodiments are applicable not only to a voice signal with a limited band as shown and described, but also to, e.g., sound signal or music signal.

In summary, it will be seen that the present invention provides a band recovering device capable of reproducing missing frequency components, which lie in an excluded band, on the basis of an input voice signal.

The entire disclosure of Japanese patent application No. 2003-36607 filed on Feb. 14, 2003, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

The invention claimed is:

1. A band recovering device for recovering frequency components lying in a frequency band lost due to band-limitation of a sound signal, comprising:

a peak-limiting amplifier configured to amplify an input narrow-band voice signal while preventing a resulting amplified voice signal from exceeding a predetermined maximum amplitude;

a peak-limitation detector configured to detect whether or not a level of the amplified voice signal output from said peak-limiting amplifier is substantially coincident with the maximum amplitude;

an amplification controller configured to increase at least either one of an amplification factor and an amount of amplification of said peak-limiting amplifier until the level of the amplified voice signal output from said peak-limitation detector is substantially coincident with the maximum amplitude; and a band recovering circuit configured to use a voice signal component of the amplified voice signal output from said peak-limiting amplifier and the input narrow-band voice signal to produce a band-recovered voice signal including the frequency components lying in the frequency band lost, the voice signal component being in frequency higher than the input narrow-band voice signal.

2. The device in accordance with claim 1, further comprising a voice detector configured to detect at least a voiced sound signal on the basis of the input narrow-band voice signal, wherein said amplification controller increases at least either one of the amplification factor and the amount of amplification when said voice detector is detecting at least a voiced sound signal.

3. The device in accordance with claim 2, further comprising a frequency shifter configured to shift frequency components of the input narrow-band voice signal toward the frequency band to be recovered, wherein said voice detector detects at least an unvoiced sound signal on the basis of the input narrow-band voice signal, and wherein said frequency shifter shifts the frequency components of the input narrow-band voice signal toward the frequency band to be recovered only when said voice detector is detecting an unvoiced sound signal.

4. The device in accordance with claim 1, further comprising a frequency shifter configured to shift frequency components of the input narrow-band voice signal toward the frequency band to be recovered, and a voice detector configured to detect at least an unvoiced sound signal on the basis of the input narrow-band voice signal; wherein said frequency shifter shifts the frequency components of the input narrow-band voice signal toward the frequency band to be recovered when said voice detector is detecting an unvoiced sound signal.

5. The device in accordance with claim 1, wherein said band recovering circuit comprises an amplitude adjusting section configured to adjust an amplitude of the amplified voice signal output from said peak-limiting amplifier for outputting an adjusted signal, and a signal generating section configured to combine said adjusted signal with the input narrow-band voice signal in a preselected ratio for thereby generating the band-recovered voice signal.

6. The device in accordance with claim 5, wherein said amplitude adjusting section comprises a band-pass filter configured to pass the voice signal component.

7. The device in accordance with claim 5, wherein said amplitude adjusting section comprises a characteristic correcting filter configured to pass the voice signal component while adjusting amplitudes of said frequency components in accordance with said frequency band to be recovered.

8. A telephone set comprising a band recovering device for recovering frequency components lying in a frequency band lost due to band-limitation of a sound signal, wherein said band recovering device comprises:

a peak-limiting amplifier configured to amplify an input narrow-band voice signal while preventing a resulting amplified voice signal from exceeding a predetermined maximum amplitude;

a peak-limitation detector configured to detect whether or not a level of the amplified voice signal output from said peak-limiting amplifier is substantially coincident with the maximum amplitude;

an amplification controller configured to increase at least either one of an amplification factor and an amount of amplification of said peak-limiting amplifier until the level of the amplified voice signal output from said peak-limitation detector is substantially coincident with the maximum amplitude; and a band recovering circuit configured to use a voice signal component of the amplified voice signal output from said peak-limiting amplifier and the input narrow-band voice signal to produce a band-recovered voice signal including the frequency components lying in the frequency band lost, the voice signal component being in frequency higher than the input narrow-band voice signal.

* * * * *